US008664014B2

(12) United States Patent
Li et al.

(10) Patent No.: US 8,664,014 B2
(45) Date of Patent: Mar. 4, 2014

(54) HIGH PRODUCTIVITY COMBINATORIAL WORKFLOW FOR PHOTORESIST STRIP APPLICATIONS

(75) Inventors: Bei Li, Fremont, CA (US); Sean Barstow, San Jose, CA (US); Anh Duong, Fremont, CA (US); Zhendong Hong, San Jose, CA (US); Ashley Lacey, Dublin, CA (US)

(73) Assignee: Intermolecular, Inc., San Jose, CA (US)

( * ) Notice: Subject to any disclaimer, the term of this patent is extended or adjusted under 35 U.S.C. 154(b) by 244 days.

(21) Appl. No.: 13/298,524

(22) Filed: Nov. 17, 2011

(65) Prior Publication Data
US 2013/0130414 A1    May 23, 2013

(51) Int. Cl.
*G01R 31/26* (2006.01)
*H01L 21/66* (2006.01)

(52) U.S. Cl.
USPC .................................. 438/17; 257/E21.531

(58) Field of Classification Search
USPC ................................ 438/14, 17; 257/E21.531
See application file for complete search history.

(56) References Cited

U.S. PATENT DOCUMENTS

| 3,944,421 | A | 3/1976 | Lewis |
| 7,592,264 | B2 | 9/2009 | Christenson |
| 8,026,200 | B2 | 9/2011 | Cooper |
| 8,216,384 | B2 * | 7/2012 | Kumar et al. ............ 134/3 |
| 2007/0089761 | A1 | 4/2007 | Banerjee et al. |
| 2007/0227556 | A1 | 10/2007 | Bergman |
| 2010/0048419 | A1 * | 2/2010 | Hashim et al. ............ 506/12 |

OTHER PUBLICATIONS

Henson, W.K., et al.; Estimating Oxide Thickness of Tunnel Oxides Down to 1.4 nm Using Conventional Capacitance Voltage Measurements on MOS Capacitors; Apr. 1, 1999; AMD—Advanced Micro Devices, Inc.; IEEE Electron Device Letters vol. 20 No. 4 pp. 179181.
Choi, C., et al; MOS CV Characterization of Ultrathin Gate Oxide Thickness 1.31.8 nm; Jun. 1, 1999; TSMC-HP-Stanford-DARPA; IEEE Electron Device Letters vol. 20 No. 6 pp. 292294.
Lue, H., et al.; An Improved TwoFrequency Method of Capacitance Measurement for SrTiO3 as Highk Gate Dielectric; Sep. 1, 2002; National Chiao-Tung University, Hsinchu, Taiwan; IEEE Electron Device Letters vol. 23 No. 9 pp. 553555.
Kouda, M. et al; Charged Defects Reduction in Gate Insulator with Multivalent Materials; Jan. 1, 2009; Tokyo Institute of Technology; Symposium on VLSI Technology Digest of Technical Papers 200201.
Mertens, P.W.., et al.; Challenges and Novel Approaches for Photo Resist Removal and PostEtch Residue Removal for 22 nm Interconnects; Jan. 1, 2009; IMEC; pp. 237239.
Levitin, G., et al.; Photoresist and Etch Residue Removal; Jan. 1, 2006; Goergia Institute of Technology; Journal of Electrochemical Society 153 7 G712G720.
USPTO; Office Action for U.S. Appl. No. 12/614,310 mailed on Jun. 20, 2011; USPTO; Unknown.
USPTO; Office Action for U.S. Appl. No. 12/614,310 mailed on Oct. 19, 2011; USPTO; Unknown.

* cited by examiner

*Primary Examiner* — Leonard Chang

(57) ABSTRACT

Electrical testing of metal oxide semiconductor (MOS) high-k capacitor structures is used to evaluate photoresist strip or cleaning chemicals using a combinatorial workflow. The electrical testing can be able to identify the damages on the high-k dielectrics, permitting a selection of photoresist strip chemicals to optimize the process conditions in the fabrication of semiconductor devices. The high productivity combinatorial technique can provide a compatibility evaluation of photoresist strip chemicals with high-k devices.

20 Claims, 18 Drawing Sheets

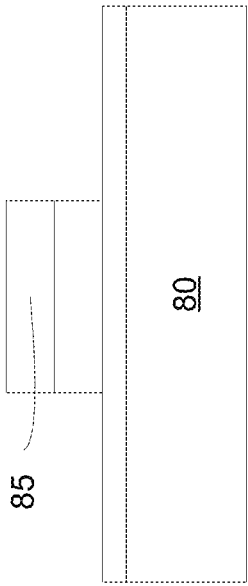
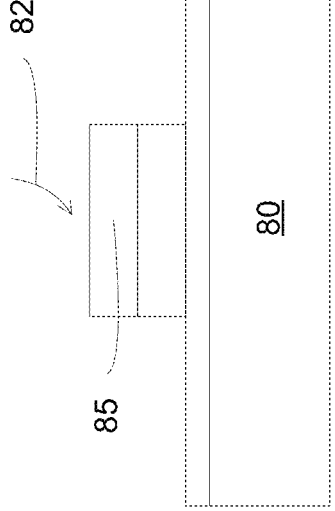
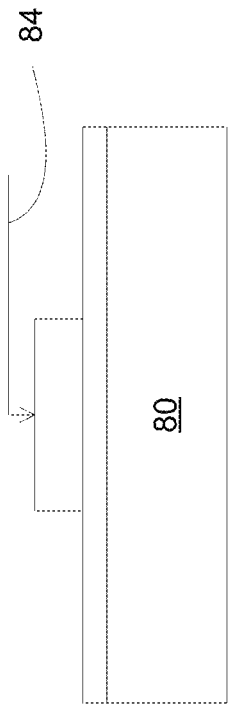
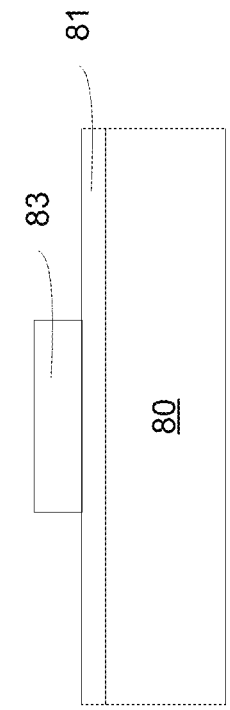
FIG. 8A  FIG. 8B  FIG. 8C  FIG. 8D  FIG. 8E  FIG. 8F

HIGH PRODUCTIVITY COMBINATORIAL WORKFLOW FOR PHOTORESIST STRIP APPLICATIONS

FIELD OF THE INVENTION

The present invention relates generally to combinatorial methods for device process development. More specifically, combinatorial methods of developing fabrication processes for gate electrode and metal gate electrode devices with regard to wet process chemicals, such as photoresist strip chemicals.

BACKGROUND OF THE INVENTION

Advances in semiconductor processing have demanded ever-increasing high functional density with continuous size scaling. This scaling process has led to the adoption high-k gate dielectrics and metal gate electrodes in metal gate stacks in semiconductor devices.

High-k gate dielectrics can offer a way to scale down the thickness of the gate dielectric with acceptable gate leakage current. The use of high-k gate dielectrics is often accompanied by a metal gate electrode, since thin gate dielectric layers may cause poly depletion, affecting the device operation and performance. Metal gate electrodes further have an advantage of higher electrical conductance, as compared to poly gates, and thus can improve signal propagation times.

The manufacture of high-k dielectric devices entails the integration and sequencing of many unit processing steps, with potential new process developments, since in general, high-k gate dielectrics are much more sensitive to process conditions than silicon dioxide. For example, organic solvents are typically used in stripping photoresist which has been used for patterning of high-k materials, to address the sensitivity of high-k dielectric materials to standard wet processes. However, organic solvents can leave residual carbon on the high-k gate stacks, affecting subsequent fabrication processes, and consequently the performance of the high-k gate structures. As an example, unremoved residual photoresist on high-k dielectrics has been observed to cause threshold voltage shift with increasing inversion thickness. The precise sequencing and integration of the unit processing steps enables the formation of functional devices meeting desired performance metrics such as power efficiency, signal propagation, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD). However, HPC processing techniques have not been successfully adapted to the development of wet chemicals to prevent degradation of high-k device performance.

Therefore, there is a need to apply high productivity combinatorial techniques to the development and investigation of liquid materials and wet processes for the manufacture of high-k devices.

SUMMARY OF THE DESCRIPTION

In some embodiments, the present invention discloses electrical testing of metal oxide semiconductor (MOS) capacitor structures to evaluate wet processing chemicals. Advanced devices can utilize novel dielectric materials, such as high-k gate dielectrics or low-k interlevel dielectrics, which might experience performance side effects under exposure to wet processing chemicals, such as photoresist strip or cleaning chemicals. The present electrical testing can be able to identify the damages on the dielectrics, permitting a selection of wet processing chemicals to optimize the process conditions for dielectric layers in the fabrication of semiconductor devices.

In some embodiments, the present invention discloses combinatorial workflow for evaluating wet processing chemicals, such as photoresist strip chemicals, to provide optimized process conditions for gate stack formation, preferably for metal gate stack using high-k dielectrics. MOS capacitor devices are combinatorially fabricated on multiple regions of a substrate, with each region exposed to a different photoresist strip chemical. The MOS capacitor devices are then electrically tested, and the electrical data are compared to categorize the potential damages of different photoresist strip chemicals and identify suitable photoresist strip chemicals based on desired device requirements.

In some embodiments, the invention discloses combinatorially exposing only the dielectric layer to photoresist strip chemicals before electrically testing the MOS devices. In other embodiments, the invention discloses combinatorially exposing both the dielectric layer and the electrode to photoresist strip chemicals before electrically testing the MOS devices.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIGS. 8A-8F illustrate an exemplary process sequence of evaluating device characteristics after exposing the dielectric layer and the electrode to photoresist strip chemical according to some embodiments of the present invention.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In FIGS. 3-9 below, exemplary methods for evaluating wet chemicals, such as photoresist strip chemicals, are illustrated using a simple planar structure. Those skilled in the art will appreciate that the description and teachings to follow can be readily applied to any simple or complex testing methodology. The drawings are for illustrative purposes only and do not limit the application of the present invention.

"Combinatorial Processing" generally refers to techniques of differentially processing multiple regions of one or more substrates. Combinatorial processing can be used to produce and evaluate different materials, chemicals, processes, process and integration sequences, and techniques related to semiconductor fabrication. For example, combinatorial processing can be used to determine optimal processing parameters (e.g., power, time, reactant flow rates, temperature, etc.) of dry processing techniques such as dry etching (e.g., plasma etching, flux-based etching, reactive ion etching (RIE)) and dry deposition techniques (e.g., physical vapor deposition (PVD), chemical vapor deposition (CVD), atomic layer deposition (ALD), etc.).

Combinatorial processing generally varies materials, unit processes or process sequences across multiple regions on a substrate. The varied materials, unit processes, or process sequences can be evaluated (e.g., characterized) to determine whether further evaluation of certain process sequences is warranted or whether a particular solution is suitable for production or high volume manufacturing.

Figure 1:
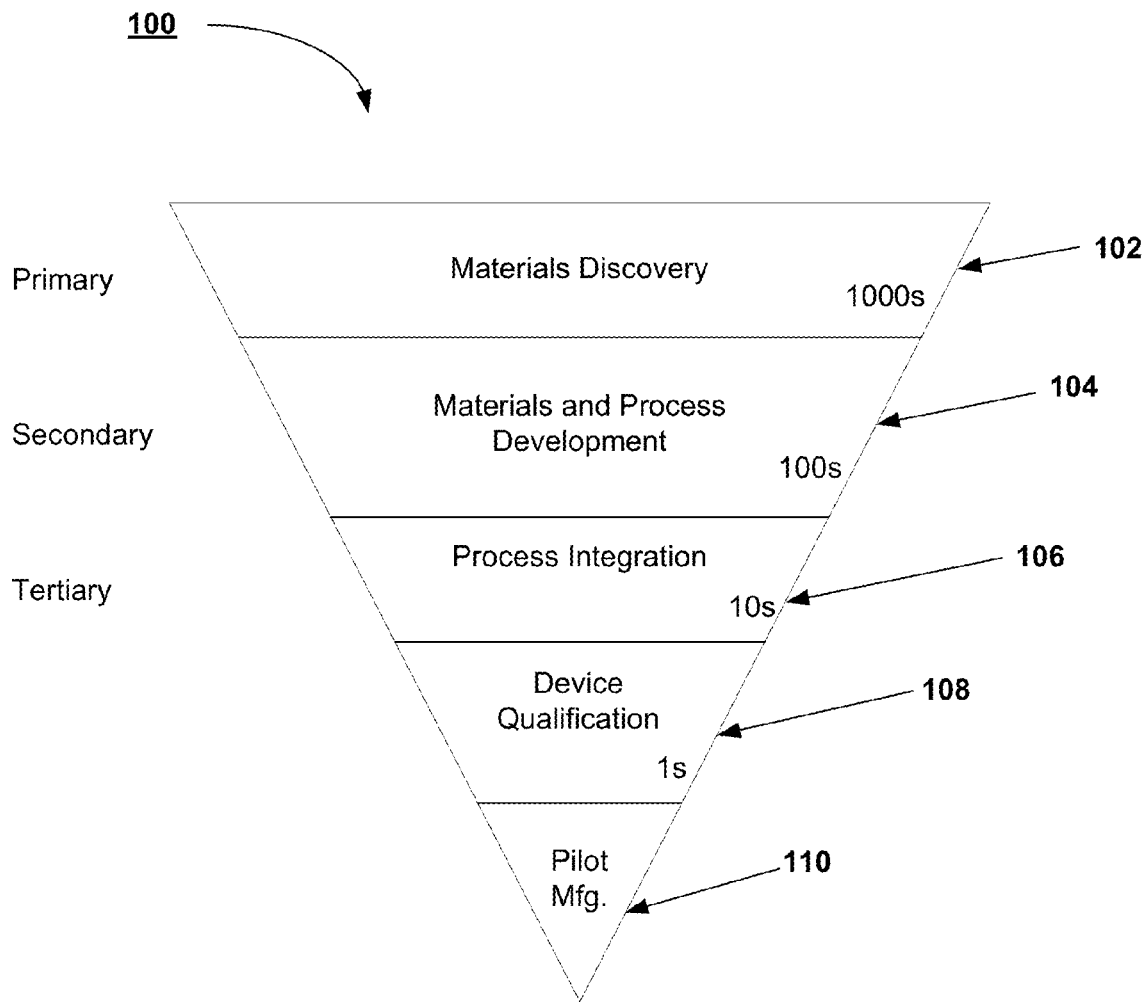
FIG. 1 illustrates a schematic diagram, 100, for implementing combinatorial processing and evaluation using primary, secondary, and tertiary screening.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of high-k device fabrication process with metal gate by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a high-k device. A global optimum sequence order is therefore derived, and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate which are equivalent to the structures formed during actual production of the high-k device. For example, such structures may include, but would not be limited to, high-k dielectric layers, metal gate layers, spacers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
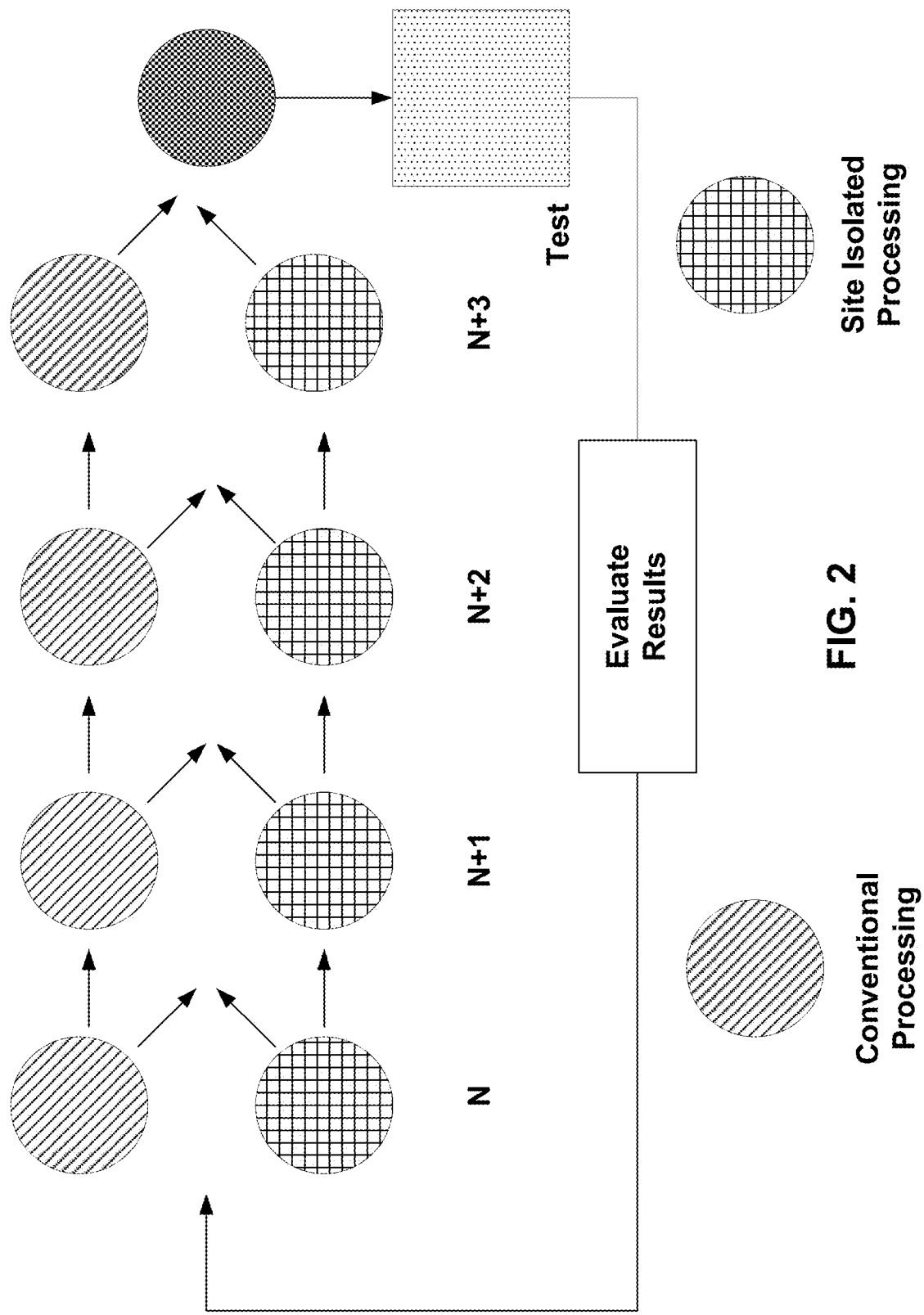
FIG. 2 is a simplified schematic diagram illustrating a general methodology for combinatorial process sequence integration that includes site isolated processing and/or conventional processing in accordance with one embodiment of the invention.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

In some embodiments, the present invention discloses electrical testing of semiconductor devices to evaluate wet processing chemicals, for example, to identify chemicals or process conditions that can affect the device performance. The wet processing chemicals can be cleaning chemicals, wet etch chemicals, or photoresist strip chemicals. In the following description, photoresist strip chemicals are described in preferred embodiments, but the invention is not so limited, and can be used for evaluating any wet processing chemical.

Advanced semiconductor devices can employ novel materials such as metal gate electrodes and high-k dielectrics, which comprise dielectric materials having a dielectric constant greater than that of silicon dioxide. Typically high-k dielectric materials include aluminum oxide, hafnium oxide, zirconium oxide, tantalum oxide, titanium oxide, or their alloys such as hafnium silicon oxide or zirconium silicon oxide. Metal gate materials typically comprise a refractive metal or a nitride of a refractive metal, such as titanium nitride, titanium aluminum nitride, or titanium lanthanum nitride. High-k dielectric and metal electrode materials can be highly sensitive to wet processing chemicals, and can exhibit device degradation if improper chemicals or process conditions are used.

In some embodiments, the present invention discloses methods to evaluate potential impact of various chemistries and processes on transistor performance and reliability, comprising electrical testing of metal oxide semiconductor (MOS) capacitor structures. MOS capacitor structures can be quickly and economically fabricated, permitting evaluating potential device degradations of various chemicals and process conditions with fast turn-around times. Electrical testing can provide device damage information with adequate sensitivity to permit distinguishing the effects of various wet chemical materials and device fabrication processes. For example, flatband voltage measurements can provide information directly related to the performance of high-k dielectric, such as the presence of fixed charges, mobile charges or surface state charges in the high-k or at the high-k dielectric/semiconductor interface.

Figure 3:
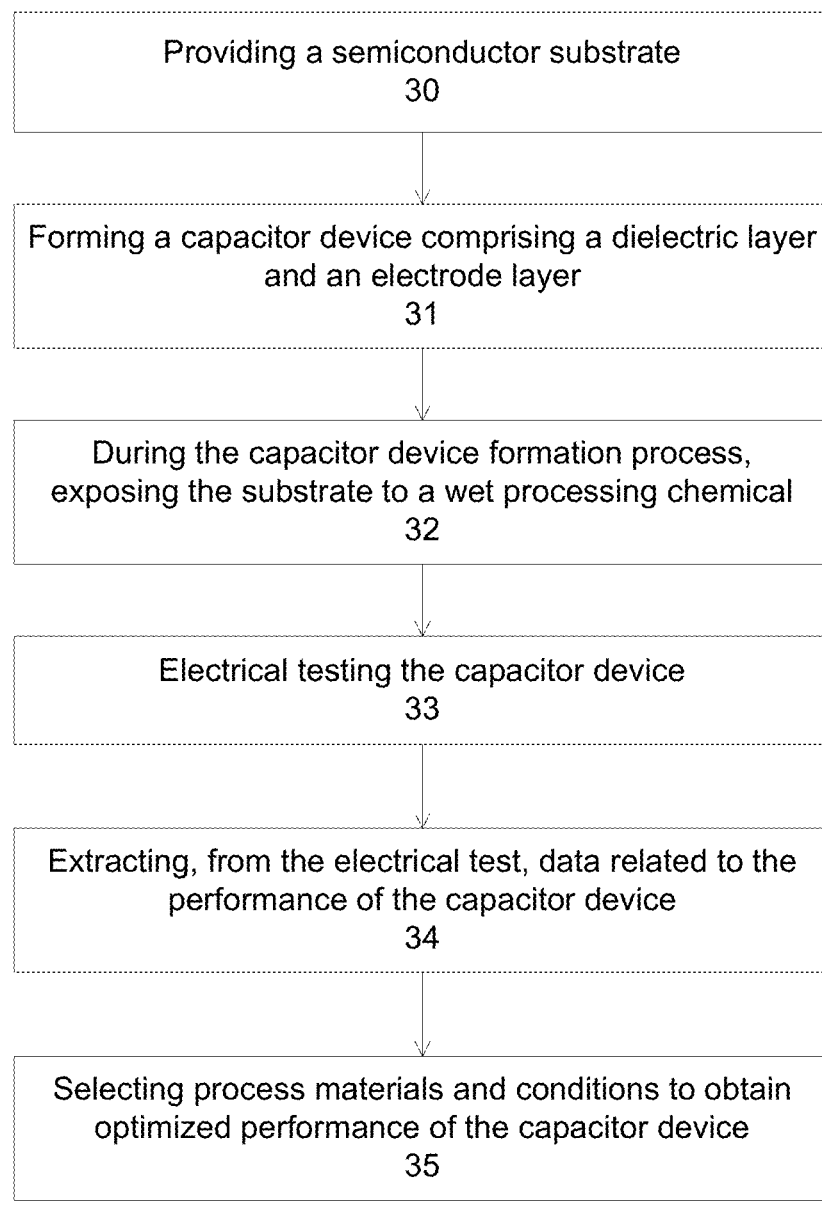
FIG. 3 illustrates an exemplary flowchart for screening wet process chemicals, such as photoresist strip chemicals, according to some embodiments of the present invention.

FIG. 3 illustrates an exemplary flowchart for screening wet process chemicals, such as photoresist strip chemicals, according to some embodiments of the present invention. During the fabrication of an MOS capacitor structure, representing a gate stack of a transistor device, the structure is exposed to a photoresist strip chemical, to simulate the actual device fabrication of photoresist stripping on gate stack formation. The electrical performance of the MOS capacitor device can indicate the possible side effects of the photoresist strip chemical, permitting a quick ranking of various photoresist strip chemicals. Poor performance photoresist strip chemicals can be identified and removed without the needs to fabricate and test fully-operation devices.

In operation 30, a semiconductor substrate is provided. The semiconductor substrate can be a silicon-containing substrate, a germanium-containing substrate, an III-V or II-VI substrate, or any other substrate containing a semiconductor element. In operation 31, MOS capacitor structures are fabricated, comprising forming a dielectric layer on the semiconductor substrate and an electrode layer on the dielectric layer. The dielectric layer, preferably comprising a high-k dielectric material, is deposited on the whole substrate. The electrode layer preferably comprising a refractive metal, and more preferably a nitride of a refractive metal, is deposited by a shadow mask process. A typical shadow mask process comprises disposing an external mask layer having a plurality of apertures on the substrate and subjecting the substrate with the mask layer to a deposition process, such as physical vapor deposition (PVD). The deposition material is deposited on the substrate through the apertures, forming the electrode pattern.

In operation 32, the substrate is exposed to a wet processing chemical, such as a photoresist strip chemical. For example, the substrate can be submerged in a liquid bath containing the photoresist strip chemical. Alternatively, the photoresist strip chemical can be disposed on the substrate for a certain time before being removed. The exposure can be performed during any step of the MOS capacitor formation, such as after forming the dielectric layer, after forming the electrode layer, or optionally after any additional process, such as an electrode anneal process or a photoresist coating process. Optional processing steps can be added, such as a cleaning step or a rinsing step, to simulate the actual transistor fabrication processes.

In operation 33, the capacitor device, comprising an electrode disposed on a dielectric layer on the semiconductor substrate, is electrically tested. The electrical tests can comprise a flatband voltage measurement, for example, to determine the presence of charges in the dielectric and at the dielectric/semiconductor interface. The electrical tests can comprise I-V and C-V measurements, including single curve or cycling testing, with varying sweep voltage range, sweep speed, or sweep frequency, which can offer possible correlation to the defect states.

In some embodiments, control capacitor devices are also fabricated and tested. The control devices are fabricated in the same process steps as the test devices, except without the photoresist strip exposure step. Comparing the test devices and the control devices can enable the observation of the performance difference with and without photoresist exposure.

In operation 34, data related to the performance of the capacitor device is extracted from the electrical test. In operation 35, photoresist strip chemicals and process conditions are selected based on a comparison of the device performance.

In some embodiments, the electrical testing of MOS device with exposure to various photoresist strip chemicals can offer a list of process compatibility between multiple photoresist strip chemicals and other materials and conditions of the devices, such as the high-k material or the metal gate material. This list can enable the optimum device fabrication process, at least with respect to the selection of photoresist strip chemicals.

In some embodiments, the present invention discloses multiple variations of the exposure of the capacitor device to the photoresist strip chemical. The photoresist strip chemical exposure can occur after the formation of high-k gate dielectric layer, simulating a process condition of p-type devices during the fabrication of n-type devices. The photoresist strip chemical exposure can occur after the formation of metal gate electrode dielectric layer, simulating a fabrication process condition of transistor devices. The photoresist strip chemical exposure can occur after coating a layer of photoresist, simulating a photoresist strip sequence of transistor devices.

Figure 4A:
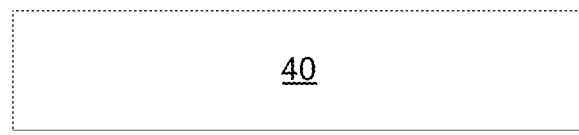
FIGS. 4A-4E illustrate an exemplary process sequence of evaluating device characteristics after exposing the dielectric layer to photoresist strip chemical according to some embodiments of the present invention.
Figure 4B:
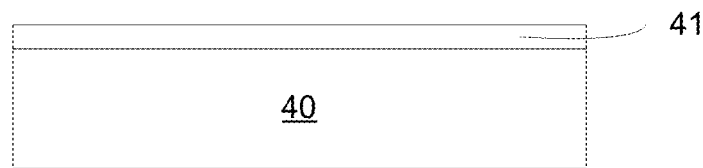

FIGS. 4A-4E illustrate an exemplary process sequence of evaluating device characteristics after exposing the dielectric layer to photoresist strip chemical according to some embodiments of the present invention. The dielectric layer preferably comprises a high-k dielectric material, and the electrode layer preferably comprises a refractive metal or a nitride of a refractive metal. In FIG. 4A, a substrate 40 is provided. In FIG. 4B, a dielectric layer 41 is formed on the substrate 40, for example, by chemical vapor deposition (CVD), or by atomic layer deposition (ALD). Various dielectric materials can be used, for example, high-k dielectric materials or composite layer of silicon dioxide and high-k material.

Figure 4C:
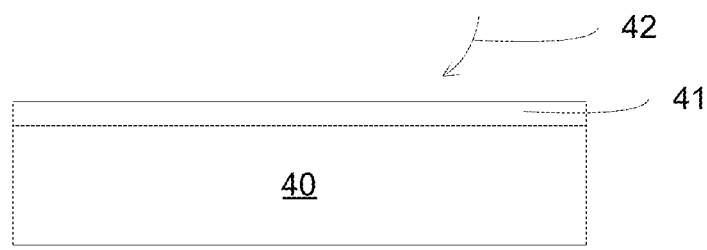
Figure 4D:
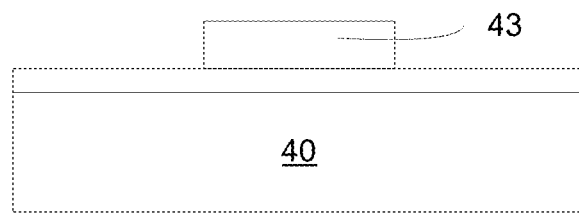
Figure 4E:
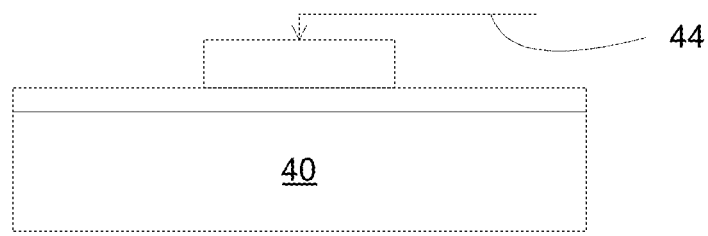

In FIG. 4C, the substrate 40 having the dielectric layer 41 disposed thereon is exposed to a photoresist strip chemical 42. Optional cleaning, rinsing and drying steps can be included. In FIG. 4D, electrode 43 is formed on the dielectric layer 41. In FIG. 4E, the MOS capacitor device, comprising top electrode 43, dielectric layer 41, and bottom electrode semiconductor substrate 40, is electrically tested, for example, by probing the top electrode 43.

Figure 5:
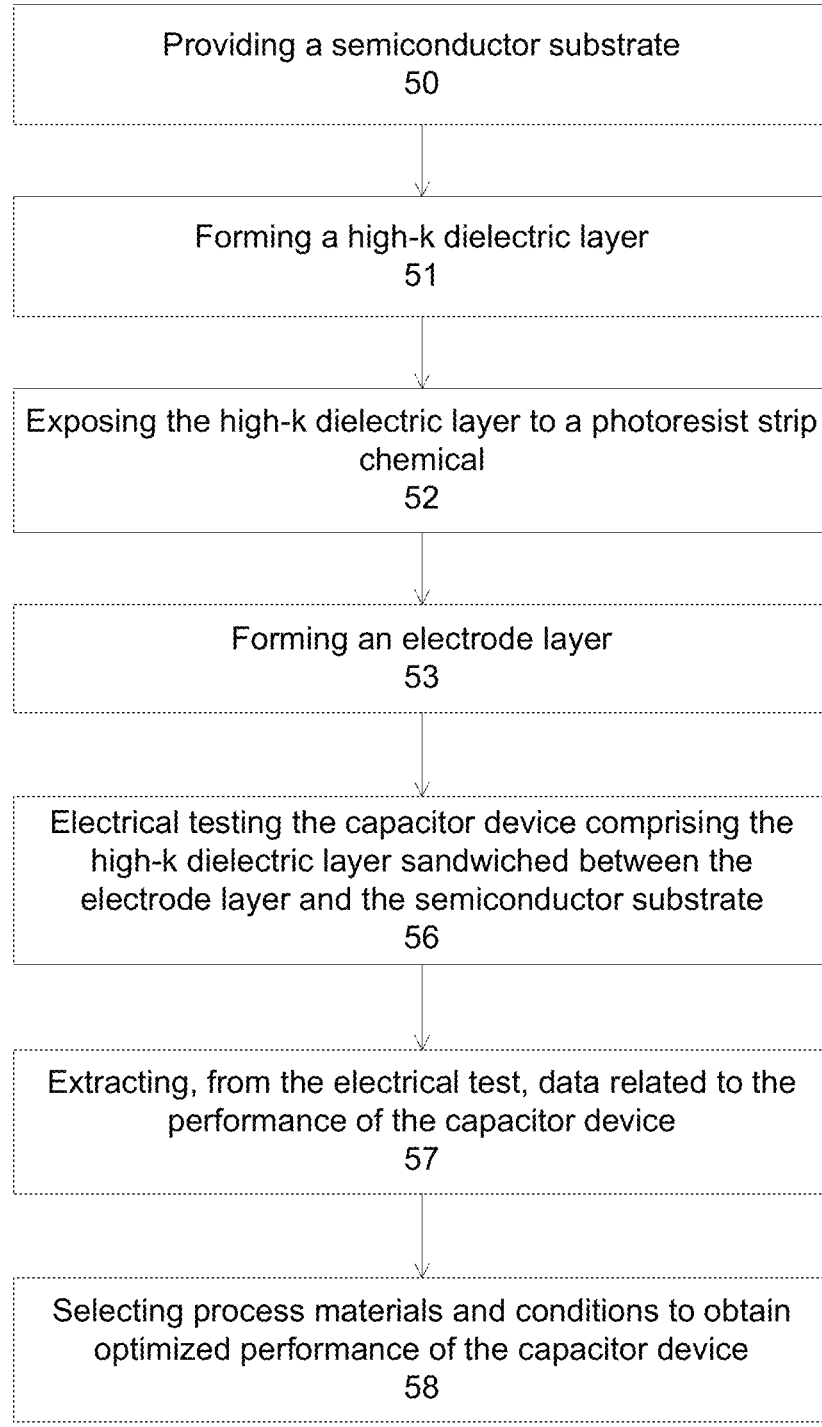
FIG. 5 illustrates an exemplary flowchart for screening photoresist strip chemicals after exposing the dielectric layer according to some embodiments of the present invention.

FIG. 5 illustrates an exemplary flowchart for screening photoresist strip chemicals after exposing the dielectric layer according to some embodiments of the present invention. The dielectric layer preferably comprises a high-k dielectric material, and the electrode layer preferably comprises a refractive metal or a nitride of a refractive metal. In operation 50, a semiconductor substrate is provided. In operation 51, a high-k dielectric layer is formed on the semiconductor substrate. In operation 52, the substrate comprising the dielectric layer is exposed to a photoresist strip chemical. Optional processing steps can be added, such as a cleaning step or a rinsing step, for example, to remove the photoresist strip chemical from the substrate surface.

In operation 53, an electrode layer is formed on the dielectric layer on the semiconductor substrate. Optional processing steps can be added, such as an annealing step, for example, a post metallization anneal with forming gas. In operation 56, the capacitor devices, which comprise an electrode on a dielectric layer on the substrate, are electrically tested. In some embodiments, control capacitor devices are also fabricated and tested.

In operation 57, data related to the performance of the capacitor device is extracted from the electrical test. In operation 58, photoresist strip chemicals and process conditions are selected based on a comparison of the device performance.

Figure 6A:
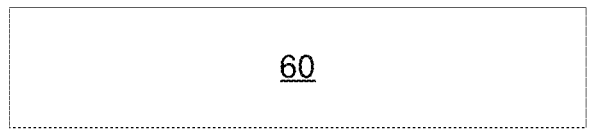
FIGS. 6A-6E illustrate an exemplary process sequence of evaluating device characteristics after exposing the dielectric layer and the electrode to photoresist strip chemical according to some embodiments of the present invention.
Figure 6B:
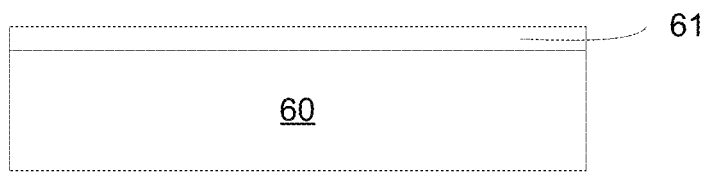
Figure 6C:
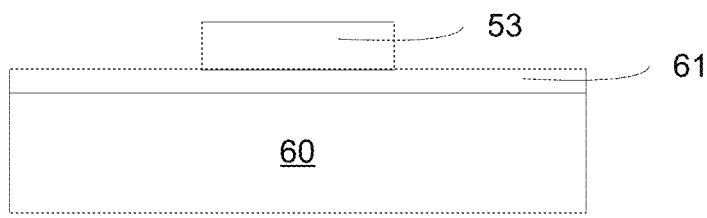

FIGS. 6A-6E illustrate an exemplary process sequence of evaluating device characteristics after exposing the dielectric layer and the electrode to photoresist strip chemical according to some embodiments of the present invention. The dielectric layer preferably comprises a high-k dielectric material, and the electrode layer preferably comprises a refractive metal or a nitride of a refractive metal. In FIG. 6A, a substrate 60 is provided. In FIG. 6B, a dielectric layer 61 is formed on the substrate 60. In FIG. 6C, electrode 63 is formed on the dielectric layer 61.

Figure 6D:
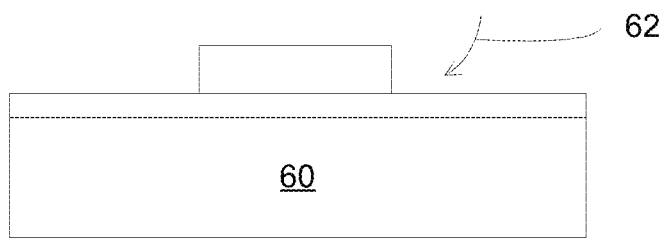
Figure 6E:
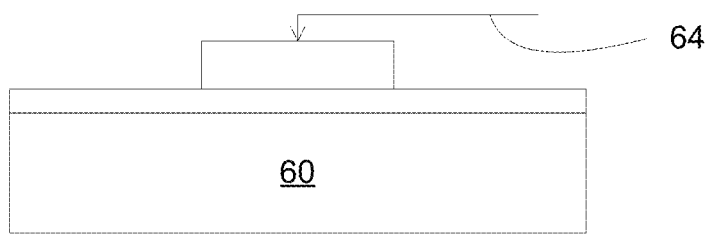

In FIG. 6D, the substrate 60 having the electrode layer 63 disposed on the dielectric layer 61 is exposed to a photoresist strip chemical 62. Optional cleaning, rinsing and drying steps can be included. In FIG. 6E, the MOS capacitor device, comprising top electrode 63, dielectric layer 61, and bottom electrode semiconductor substrate 60, is electrically tested, for example, by probing the top electrode 63.

Figure 7:
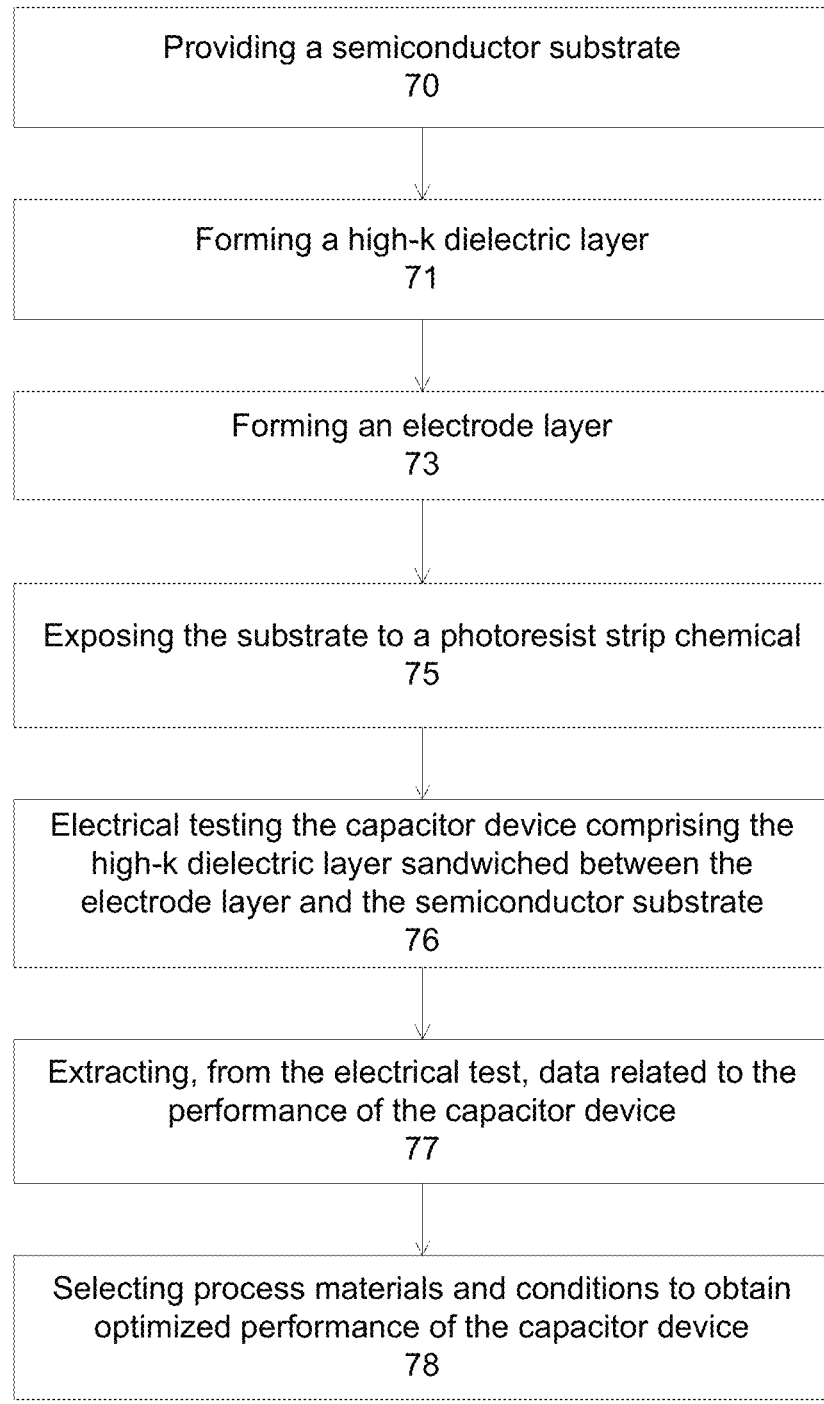
FIG. 7 illustrates an exemplary flowchart for screening photoresist strip chemicals after exposing the dielectric layer and the electrode layer according to some embodiments of the present invention.

FIG. 7 illustrates an exemplary flowchart for screening photoresist strip chemicals after exposing the dielectric layer and the electrode layer according to some embodiments of the present invention. The dielectric layer preferably comprises a high-k dielectric material, and the electrode layer preferably comprises a refractive metal or a nitride of a refractive metal. In operation 70, a semiconductor substrate is provided. In operation 71, a high-k dielectric layer is formed on the semiconductor substrate. In operation 73, an electrode layer is formed on the dielectric layer on the semiconductor substrate. Optional processing steps can be added, such as a post metallization anneal with forming gas. In operation 75, the substrate comprising the dielectric layer and the electrode layer is exposed to a photoresist strip chemical. Optional processing steps can be added, such as a cleaning step or a rinsing step, for example, to remove the photoresist strip chemical from the substrate surface.

In operation 76, the capacitor devices, which comprise an electrode on a dielectric layer on the substrate, are electrically tested. In some embodiments, control capacitor devices are also fabricated and tested. In operation 77, data related to the performance of the capacitor device is extracted from the electrical test. In operation 78, photoresist strip chemicals and process conditions are selected based on a comparison of the device performance.

FIGS. 8A-8F illustrate an exemplary process sequence of evaluating device characteristics after exposing the dielectric layer and the electrode to photoresist strip chemical according to some embodiments of the present invention. The dielectric layer preferably comprises a high-k dielectric material, and the electrode layer preferably comprises a refractive metal or a nitride of a refractive metal. In FIG. 8A, a substrate 80 is provided. In FIG. 8B, a dielectric layer 81 is formed on the substrate 80. In FIG. 8C, electrode 83 is formed on the dielectric layer 81. In FIG. 8D, photoresist layer 85 is formed on electrode 83. Alternatively, the photoresist layer 85 can cover the whole substrate (not shown), instead of forming only on the electrode 83.

In FIG. 8E, the substrate 80 having the photoresist layer 85 disposed on the electrode layer 83 disposed on the dielectric layer 61 is exposed to a photoresist strip chemical 82, which removes the photoresist layer 85. Optional cleaning, rinsing and drying steps can be included. In FIG. 8F, the MOS capacitor device, comprising top electrode 83, dielectric layer 81, and bottom electrode semiconductor substrate 80, is electrically tested, for example, by probing the top electrode 83.

Figure 9:
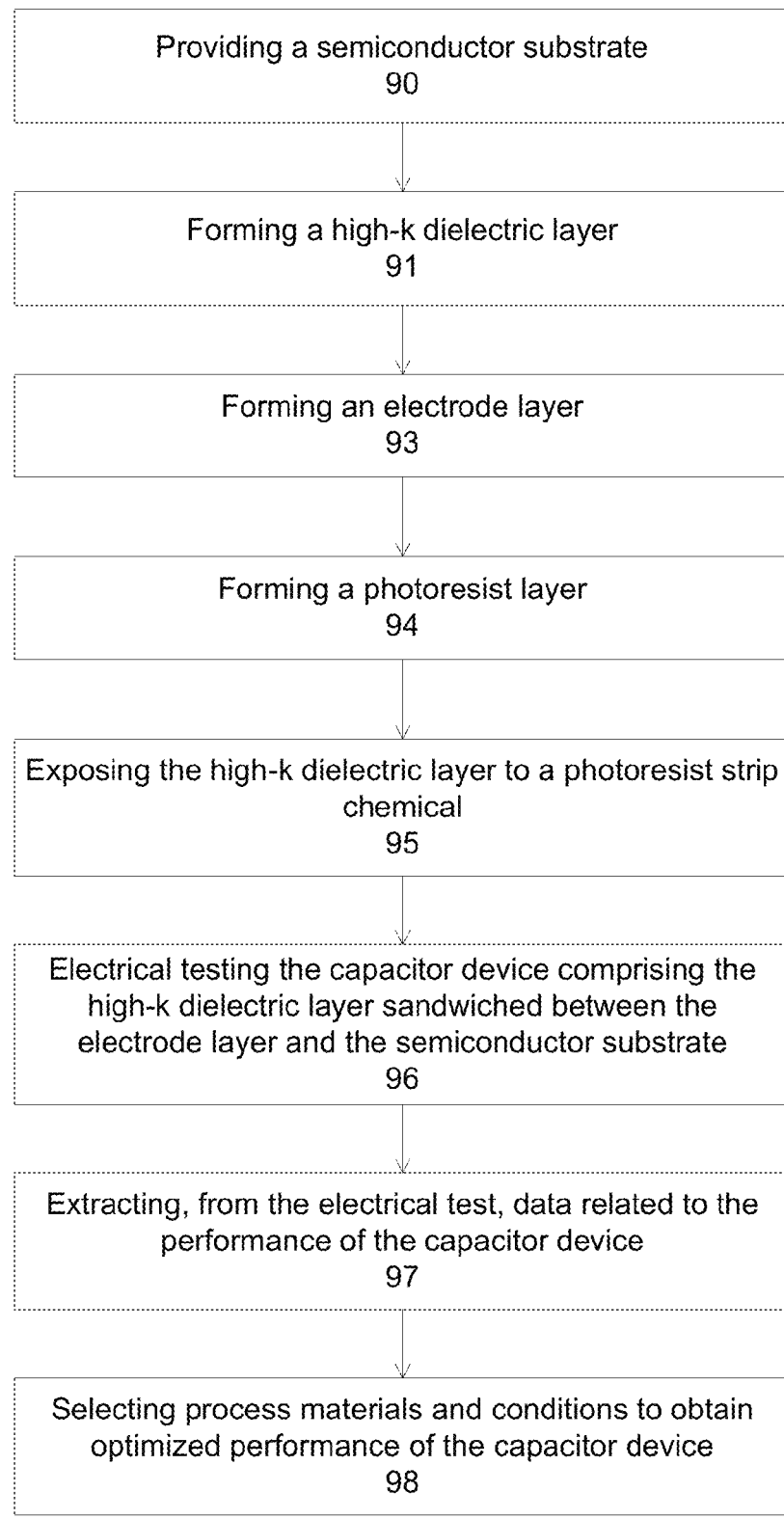
FIG. 9 illustrates an exemplary flowchart for screening photoresist strip chemicals after exposing the dielectric layer and the electrode layer according to some embodiments of the present invention.

FIG. 9 illustrates an exemplary flowchart for screening photoresist strip chemicals after exposing the dielectric layer and the electrode layer according to some embodiments of the present invention. The dielectric layer preferably comprises a high-k dielectric material, and the electrode layer preferably comprises a refractive metal or a nitride of a refractive metal. In operation 90, a semiconductor substrate is provided. In operation 91, a high-k dielectric layer is formed on the semiconductor substrate. In operation 93, an electrode layer is formed on the dielectric layer on the semiconductor substrate. Optional processing steps can be added, such as a post metallization anneal with forming gas. In operation 94, a photoresist layer is formed on the electrode layer. The photoresist layer can be a blanket layer, or can be formed only on the electrodes. In operation 95, the substrate comprising the dielectric layer and the electrode layer is exposed to a photoresist strip chemical. Optional processing steps can be added, such as a cleaning step or a rinsing step, for example, to remove the photoresist strip chemical from the substrate surface.

In operation 96, the capacitor devices, which comprise an electrode on a dielectric layer on the substrate, are electrically tested. In some embodiments, control capacitor devices are also fabricated and tested. In operation 97, data related to the performance of the capacitor device is extracted from the electrical test. In operation 98, photoresist strip chemicals and process conditions are selected based on a comparison of the device performance.

Figure 10A:
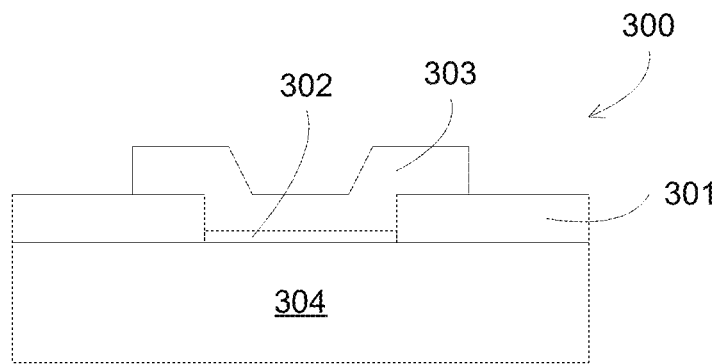
FIGS. 10A-10B illustrate other exemplary test structures according to some embodiments of the present invention.
Figure 10B:
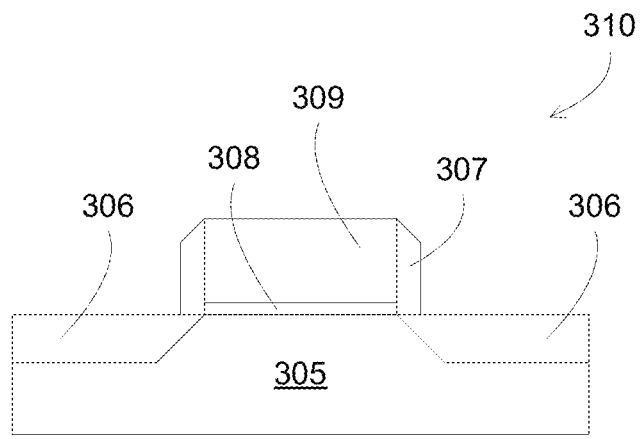

In some embodiments, other test devices can be fabricated, such as isolated capacitor structure 300 or transistor structure 310. FIGS. 10A-10B illustrate other exemplary test structures according to some embodiments of the present invention. FIG. 10A shows an isolated capacitor structure 300, comprising top electrode 303 on dielectric 302 on substrate 304. The capacitor structure 300 is isolated, for example, from nearby capacitor structures, through isolation regions 301. Electrical testing of isolated capacitor device 300 can be similar to MOS capacitor devices described above.

FIG. 10B shows a transistor structure 310, comprising source/drain 306, gate dielectric 308, gate electrode 309, and spacers 307. Electrical testing of the transistor device 310 can include transistor data, for example, threshold voltage or transistor reliability.

In some embodiments, the present invention discloses combinatorial workflow for evaluating wet processing chemicals, such as photoresist strip chemicals, to provide optimized process conditions for gate stack formation, preferably for metal gate stack using high-k dielectrics. High productivity combinatorial processing can be a fast and economical technique for electrically screening photoresist chemicals to determine their possible side effects on the transistor performance, avoiding potentially costly device process development through proper selection of photoresist strip chemicals.

In some embodiments, the dielectric layer is formed through a deposition process, such as chemical vapor deposition (CVD), atomic layer deposition (ALD), or physical vapor deposition (PVD). The electrode layer can be formed by PVD through a shadow mask. The photoresist exposure can be performed by wet exposure the portions of the substrate.

Figure 11:
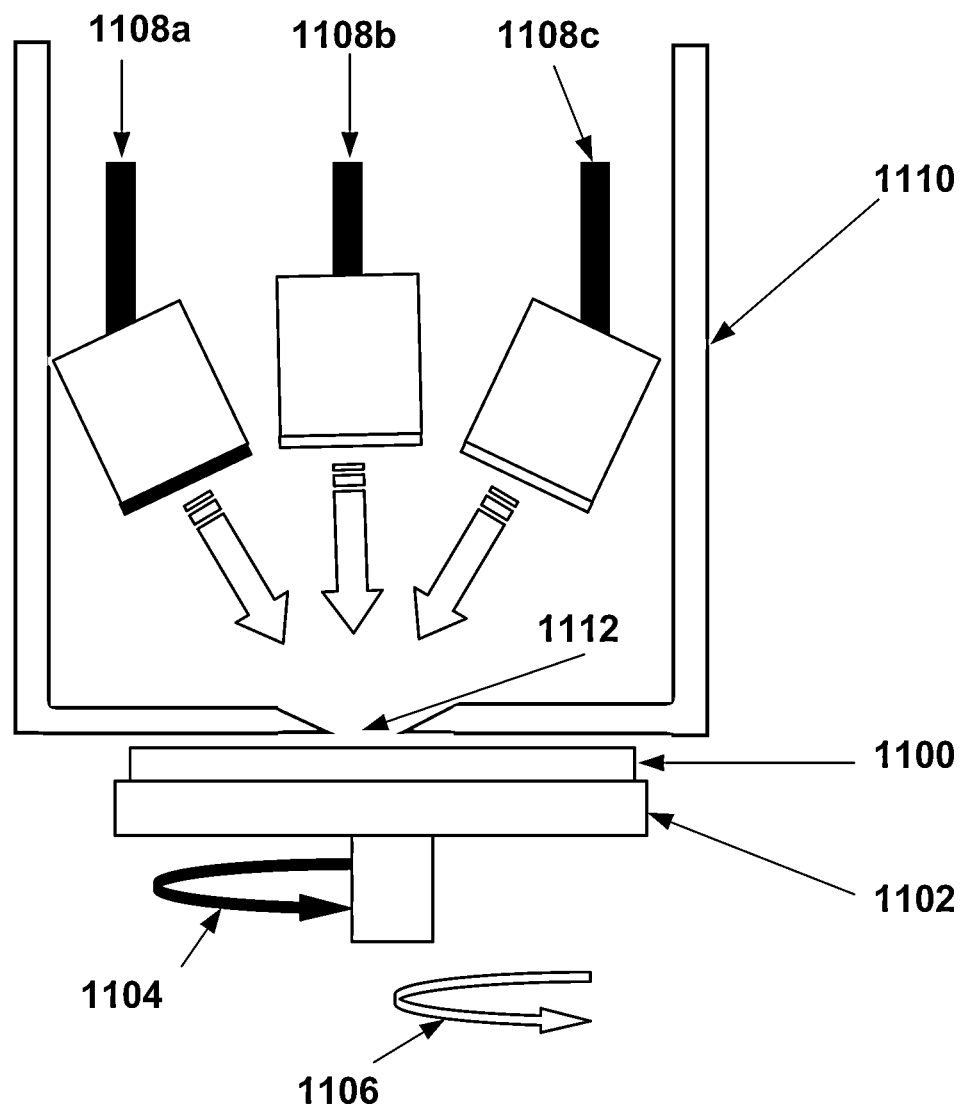
FIG. 11 illustrates a schematic diagram of a combinatorial PVD system according to an embodiment described herein.

FIG. 11 illustrates a schematic diagram of a combinatorial PVD system according to an embodiment described herein. Details of the combinatorial PVD system are described in U.S. patent application Ser. No. 12/027,980 filed on Feb. 7, 2008 and claiming priority to Sep. 5, 2007 and U.S. patent application Ser. No. 12/028,643 filed on Feb. 8, 2008 and claiming priority to Sep. 5, 2007. Substrate, 1100, is held on substrate support, 1102. Substrate support, 1102, has two axes of rotation, 1104 and 1106. The two axes of rotation are not aligned. This feature allows different regions of the substrate to be accessed for processing. The substrate support may be moved in a vertical direction to alter the spacing between the PVD targets and the substrate. The combinatorial PVD system comprises multiple PVD assemblies configured within a PVD chamber (not shown). In FIG. 11, three PVD assemblies are shown, 1108a-1108c. Those skilled in the art will appreciate that any number of PVD assemblies may be used, limited only by the size of the chamber and the size of the PVD assemblies. Typically, four PVD assemblies are contained within the chamber. Advantageously, the multiple PVD assemblies contain different target materials to allow a wide range of material and alloys compositions to be investigated. Additionally, the combinatorial PVD system will typically include the capability for reactive sputtering in reactive gases such as $O_2$, $NH_3$, $N_2$, etc. The PVD assemblies may be moved in a vertical direction to alter the spacing between the PVD targets and the substrate and may be tilted to alter the angle of incidence of the sputtered material arriving at the substrate surface. The combinatorial PVD system further comprises a process kit shield assembly, 1110. The process kit shield assembly includes an aperture, 1112, used to define isolated regions on the surface. The portion of the process kit shield assembly that includes the aperture may have both rotational and translational capabilities. The combination of the substrate support movement, PVD assembly movement, and process kit shield assembly aperture movement allows multiple regions of the substrate to be processed in a site isolated manner wherein each site can be processed without interference from adjacent regions. Advantageously, the process parameters among the multiple site isolated regions can be varied in a combinatorial manner.

Figure 12:
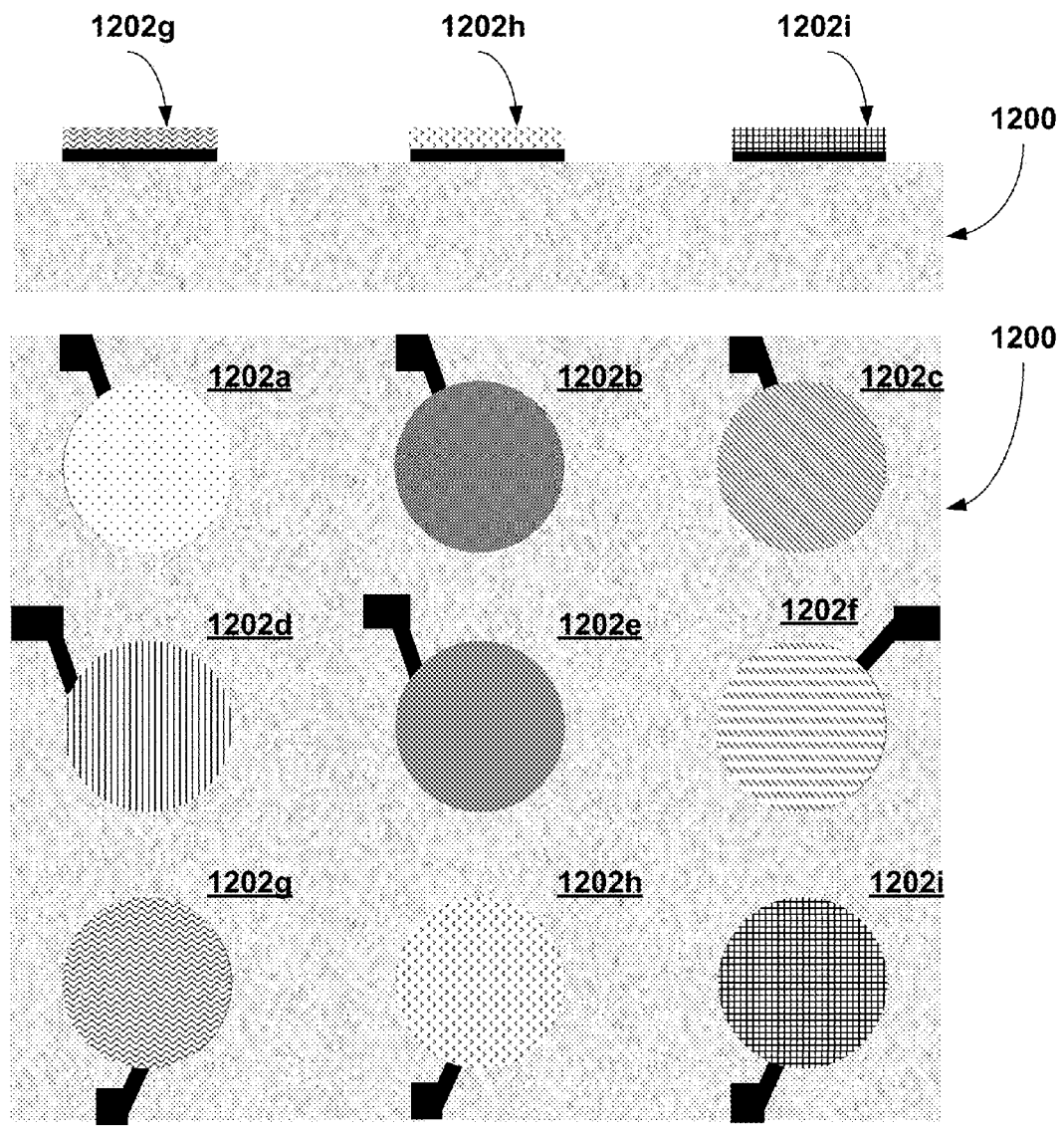
FIG. 12 illustrates a schematic diagram of a substrate that has been processed in a combinatorial manner.

FIG. 12 illustrates a schematic diagram of a substrate that has been processed in a combinatorial manner. A substrate, 1200, is shown with nine site isolated regions, 1202a-1202i, illustrated thereon. Although the substrate 1200 is illustrated as being a generally square shape, those skilled in the art will understand that the substrate may be any useful shape such as round, rectangular, etc. The lower portion of FIG. 12 illustrates a top down view while the upper portion of FIG. 12 illustrates a cross-sectional view taken through the three site isolated regions, 1202g-1202i. The shading of the nine site isolated regions illustrates that the process parameters used to process these regions have been varied in a combinatorial manner. The substrate may then be processed through a next step that may be conventional or may also be a combinatorial step as discussed earlier with respect to FIG. 2.

Figure 13:
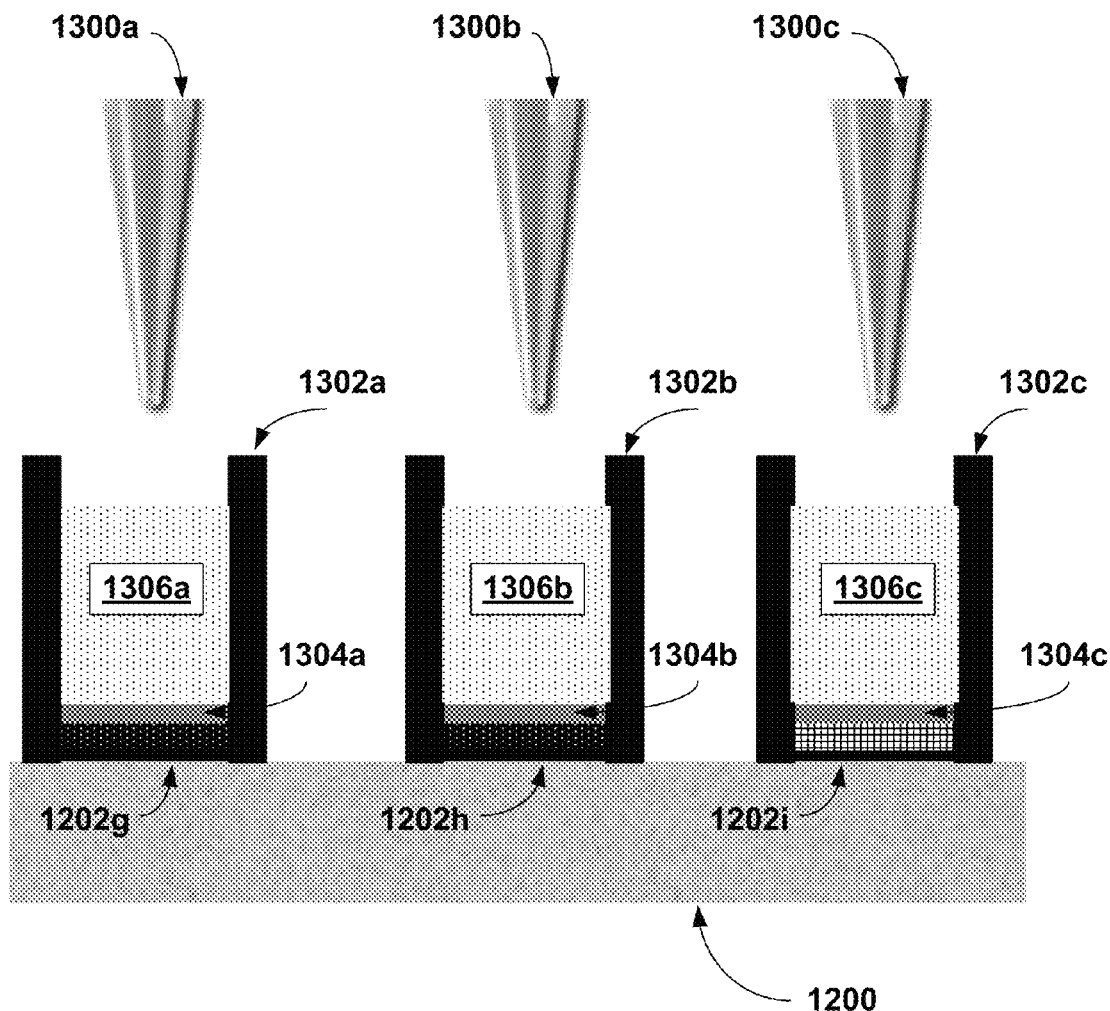
FIG. 13 illustrates a schematic diagram of a combinatorial wet processing system according to an embodiment described herein.

FIG. 13 illustrates a schematic diagram of a combinatorial wet processing system according to an embodiment described herein. In the same manner that the combinatorial PVD system may be used to investigate materials deposited by PVD, a combinatorial wet system may be used to investigate materials deposited by solution-based techniques. An example of a combinatorial wet system is described in U.S. Pat. No. 7,544,574 cited earlier. Those skilled in the art will realize that this is only one possible configuration of a combinatorial wet system. FIG. 13 illustrates a cross-sectional view of substrate, 1200, taken through the three site isolated regions, 1202g-1202i similar to the upper portion of FIG. 12. Solution dispensing nozzles, 1300a-1300c, supply different solution chemistries, 1306a-1306c, to chemical processing cells, 1302a-1302c. FIG. 13 illustrates the deposition of a layer, 1304a-1304c, on respective site isolated regions. Although FIG. 13 illustrates a deposition step, other solution-based processes such as cleaning, etching, surface treatment, surface functionalization, etc. may be investigated in a combinatorial manner. Advantageously, the solution-based treatment can be customized for each of the site isolated regions.

In a typical device fabrication process, different device portions can be exposed to photoresist strip chemicals, and therefore, in some embodiments, the present invention discloses combinatorially fabricating and evaluating the effects of photoresist strip chemicals based on various process steps in the device fabrication flow.

For example, during a device fabrication process, a photoresist is deposited on a metal gate stack comprising a metal gate electrode disposed on a high-k gate dielectric layer disposed on a semiconductor substrate. After patterning the metal gate stack, the photoresist layer is exposed to a photoresist strip chemical to completely remove the photoresist layer before a subsequent process step. In some embodiments, the present invention discloses methods to evaluate the side effects of the photoresist strip chemical under similar configuration. As an example, a photoresist layer is deposited on a metal gate stack comprising a metal electrode on a high-k dielectric layer on a substrate. The metal gate stack forms a MOS capacitor structure that can enable electrical testing to assess the integrity of the dielectric layer and the dielectric-semiconductor interface. The substrate with the metal gate stack is then exposed to a photoresist strip chemical, and electrical tests are performed on the MOS capacitor structure.

As another example, during the fabrication of n-type (or p-type) device, the high-k dielectric area of the p-type (or n-type, respectively) device is protected from being processed, for example, by a photoresist masking. Thus the high-k gate dielectric layer of the p-type device is exposed to photoresist strip chemical during the photoresist stripping process of the n-type device. In some embodiments, the present invention discloses methods to evaluating the side effects of the photoresist strip chemical under similar configuration. As an example, a photoresist layer is deposited on a high-k dielectric layer on a substrate. The substrate with the high-k dielectric layer is then exposed to a photoresist strip chemical. Afterward, metal electrode is deposited on the high-k dielectric layer to form MOS capacitor device that can enable electrical testing to assess the integrity of the dielectric layer and the dielectric-semiconductor interface.

In some embodiments, the present invention discloses testing structures for combinatorially evaluating the effects of photoresist strip chemicals. The photoresist layer can be omitted from the test structures to simplify the process flow. Further, accelerated testing can be performed to evaluate the process window of the photoresist strip exposure. For example, the exposure can be longer or at higher temperature than normal fabrication processes.

For example, the high-k dielectric layer can be exposed to a photoresist strip chemical without a photoresist layer in the test structures. A test structure can comprise a high-k dielectric layer deposited on a substrate. The substrate with the high-k dielectric layer is then exposed to a photoresist strip chemical. Metal electrode is then deposited on the high-k dielectric layer to form MOS capacitor device that can enable electrical testing. Optional processes can be added, such as cleaning and rinsing to remove any residue of the photoresist strip chemical. Post metallization anneal can be performed for the metal electrodes.

Alternatively, a high-k dielectric layer and a metal electrode can be exposed to a photoresist strip chemical without a photoresist layer in the test structures. A test structure can comprise a metal electrode layer deposited a high-k dielectric layer which is deposited on a substrate. The substrate with the metal electrode/high-k dielectric layer is then exposed to a photoresist strip chemical. The metal electrode and the high-k dielectric layer can form a MOS capacitor device that can enable electrical testing. Other test structures can also be used.

The following description describes exemplary processes using test structures. Other test or actual structures can also be used. A combinatorial testing process is described involving exposing only the dielectric layer to wet chemicals before electrically testing the MOS devices. In some embodiments, photoresist strip chemicals are screened for optimizing a metal gate stack formation using a high-k gate dielectric material. The photoresist strip chemicals screening process comprises forming a dielectric layer on a semiconductor substrate, combinatorially processing multiple regions of the semiconductor substrate comprising exposing the dielectric layer in a region of the multiple regions to a photoresist strip chemical, wherein the photoresist strip chemical is varied across the multiple regions of the semiconductor substrate, then forming a plurality of electrodes on the dielectric layer, each of the multiple regions having at least an electrode, and then electrical testing a plurality of capacitor devices, each capacitor device comprising the dielectric layer sandwiched between an electrode and the semiconductor substrate. The various electrical testing data are compared to obtain a photoresist strip chemical among the plurality of photoresist strip chemicals meeting a desired requirement. The dielectric layer preferably comprises a high-k material, such as hafnium oxide, hafnium silicon oxide, zirconium oxide, zirconium silicon oxide, or aluminum oxide. Other high-k materials can also be used.

In some embodiments, a control capacitor device is formed in a control region on the semiconductor substrate. The control capacitor possesses similar structure and fabrication process as the test capacitor devices, but without the photoresist strip exposure. For example, the control capacitor device can comprise a dielectric layer sandwiched between an electrode and the semiconductor substrate, wherein the control region, e.g., the portion encompassing the substrate, the dielectric layer, and the electrode layer, is not exposed to photoresist strip chemicals. The control capacitor device is electrical tested, and the electrical testing data of the control device is compared with those of a test device having the dielectric layer exposed to a photoresist strip chemical.

In some embodiments, the electrical testing comprises at least one of an I-V measurement, a C-V measurement, a flatband voltage shift measurement, or an effective work function measurement.

In some embodiments, additional process steps can be added, such as cleaning, rinsing after the photoresist strip chemical exposure, or a post metallization anneal for the metal electrodes.

In some embodiments, the electrode layer can comprise a metal material or a metal alloy material, such as titanium, tantalum, or ruthenium. The electrode layer also can comprise a nitride metal material or nitride alloy material, such as titanium nitride, tantalum nitride, ruthenium nitride, titanium aluminum nitride, or titanium lanthanum nitride. The electrodes are preferably formed by a shadow mask deposition process. In a shadow mask deposition process, a thin mask, for example, made of stainless steel material, having a plurality of aperture openings therethrough, is disposed in intimate contact with a substrate before subjecting the substrate to a metal deposition, such as a PVD process.

Another combinatorial testing process is described involving exposing both the dielectric layer and the electrode to wet process chemicals before electrically testing the MOS devices. In some embodiments, photoresist strip chemicals are screened for optimizing a metal gate stack formation using a high-k gate dielectric material. The photoresist strip chemicals screening process comprises forming a dielectric layer on a semiconductor substrate, forming a plurality of electrodes on the dielectric layer, and then combinatorially processing multiple regions of the semiconductor substrate. Each of the multiple regions preferably comprises at least an electrode, e.g., at least a MOS capacitor device. The combinatorially processing comprises exposing the electrode and the dielectric layer in a region of the multiple regions to a photoresist strip chemical, with the photoresist strip chemicals varied in a combinatorial manner across the multiple regions of the semiconductor substrate. Afterward, the plurality of capacitor devices is electrically tested, with each capacitor device comprising the dielectric layer sandwiched between an electrode and the semiconductor substrate. The various electrical testing data are compared to obtain a photoresist strip chemical among the plurality of photoresist strip chemicals meeting a desired requirement. The dielectric layer preferably comprises a high-k material.

In some embodiments, a control capacitor device is formed in a control region on the semiconductor substrate. The control capacitor device is electrical tested, and the electrical testing data of the control device is compared with those of a test device having the dielectric layer exposed to a photoresist strip chemical.

Figure 14:
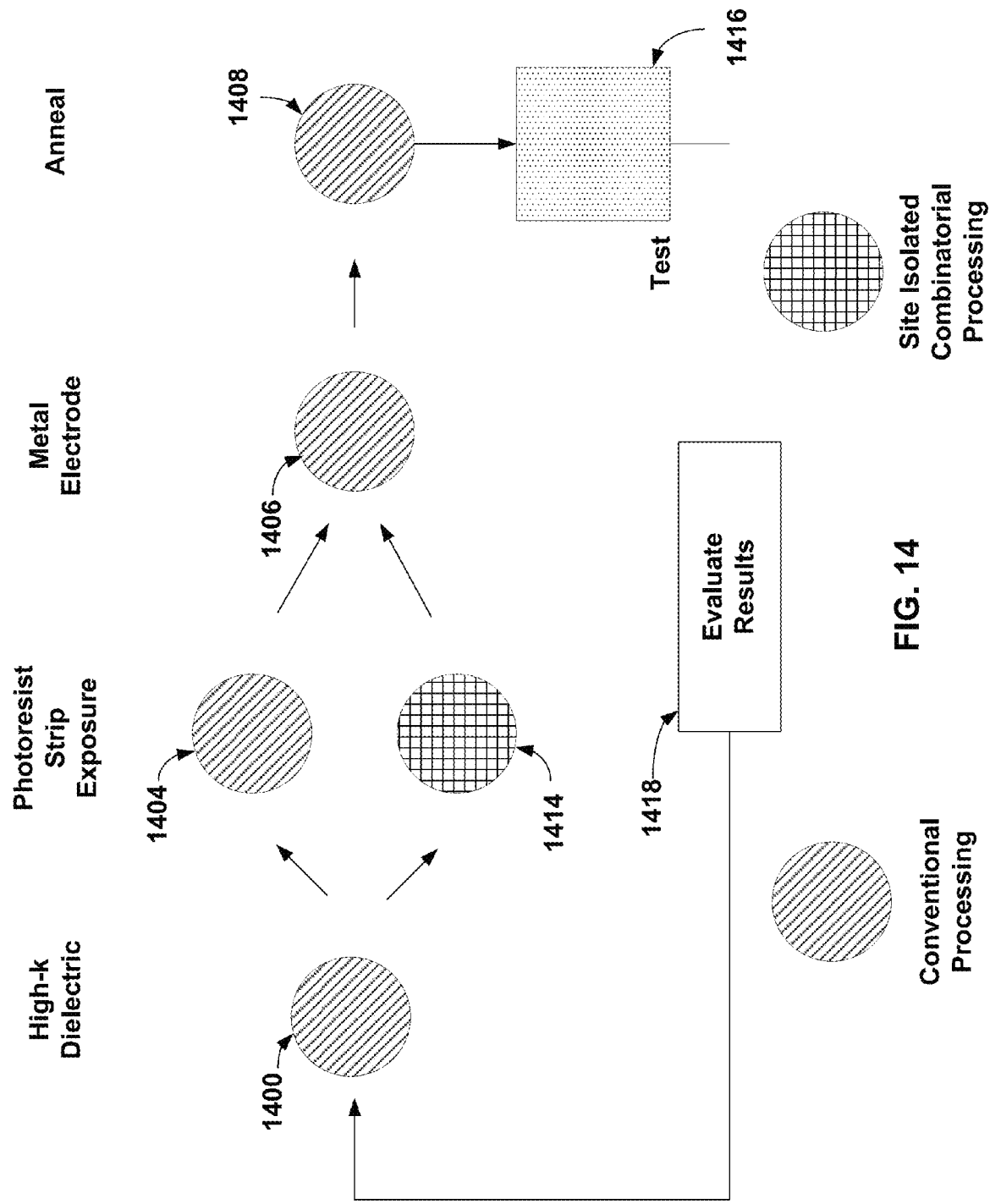
FIG. 14 illustrates a flow diagram for forming simple test structures according to an embodiment described herein.

FIG. 14 illustrates a flow diagram for forming simple test structures according to an embodiment described herein. As discussed in relation to FIG. 3, several of the layers or process steps provide opportunities to apply combinatorial techniques to the development and investigation of the materials and treatments for the layers. For evaluating photoresist strip chemicals, parameter candidates include the high-k dielectric layer, the photoresist strip exposure, and the metal electrode layer. As mentioned previously, examples of suitable high-k dielectric layers comprise hafnium oxide, zirconium oxide, aluminum oxide, or any mixture combination, etc. hafnium oxide and hafnium silicon oxide are the material most often used currently as the high-k dielectric layer for metal gate stack devices. The high-k dielectric layer may be deposited using chemical vapor deposition (CVD), atomic layer deposition (ALD), or plasma enhanced CVD or ALD. The effects of photoresist strip chemicals on the high-k layer and the high-k/semiconductor interface may be investigated using HPC techniques by varying process parameters such as high-k material, deposition process condition, surface preparation process, interface layer (such as a silicon oxide layer), etc. These are meant to be illustrative parameters and those skilled in the art will be able to apply HPC techniques to any of the commonly used process parameters.

A process step that may be investigated using HPC techniques includes the photoresist strip exposure. The photoresist strip exposure is designed to strip the photoresist layer after patterning the metal gate stack. The photoresist strip exposure may be investigated using HPC techniques by varying process parameters such as strip chemicals, chemical concentration, exposure time, chemical temperature, chemical stirring rate, etc. For example, photoresist strip chemicals can be selected from a list of commercially available chemicals, in addition to specially designed chemicals. These are meant to be illustrative parameters and those skilled in the art will be able to apply HPC techniques to any of the commonly used process parameters.

Another layer that may be investigated using HPC techniques includes the metal gate electrode layer. Examples of suitable metal gate electrode materials comprise titanium, tantalum, aluminum, lanthanum, their alloys, nitrides and nitride alloys, etc. Typically, PVD is the preferred method of deposition for the metal gate electrode layer. The deposition of the metal electrode layer by PVD may be investigated using HPC techniques by varying process parameters such as material, power, pressure, target to substrate distance, atomic ratio, etc. These are meant to be illustrative parameters and those skilled in the art will be able to apply HPC techniques to any of the commonly used process parameters.

Returning to FIG. 14, through the use of a combination of conventional and combinatorial processing systems (i.e. systems capable of processing multiple isolated regions on a single substrate) a number of trajectories through the various systems illustrated in the flow diagram of FIG. 14 can be envisioned. In FIG. 14, the high-k dielectric layer may be deposited in a conventional processing manner, 1400, in some embodiments where the high-k dielectric layer is not a variable. As discussed previously, the photoresist strip exposure may be processed in a conventional processing manner, 1404, or in a site isolated combinatorial processing manner, 1412. The metal electrode layer may be deposited in a conventional processing manner, 1406, in some embodiments where the metal electrode is not a variable. The anneal process, such as a post metallization anneal in forming gas, may be processed in a conventional processing manner, 1408. After the deposition of the various layers and subsequent processing, the various MOS capacitor devices represented by each of the site isolated regions may be testing in step 1416, and the results evaluated in step, 1418. As discussed previously, the results will form the basis for additional cycles of investigation through HPC techniques to identify materials and process conditions that evaluate the suitability of photoresist strip exposure in devices having the given high-k dielectric and metal gate electrode.

Using the simple diagram in FIG. 14, there are two possible trajectories through the process sequence, which encompass all of the possible combinations of conventional and combinatorial processing illustrated. Those skilled in the art will understand that HPC techniques may be applied to other processes not illustrated such as anneal treatments, cleaning, etching, rinsing, surface treatments, surface functionalization, etc. As more variable process steps are included, the total number of required experiments increases dramatically. This illustrates the benefits of using HPC techniques to limit the number of substrates to a manageable number and minimize the cost of the development program.

The illustrated simple diagram represents a possible evaluation process for the side effects of various photoresist strip chemicals on a specific high-k gate dielectric and metal gate electrode. The variables further include other process windows, such as the exposure temperature, time, and concentration.

Figure 15:
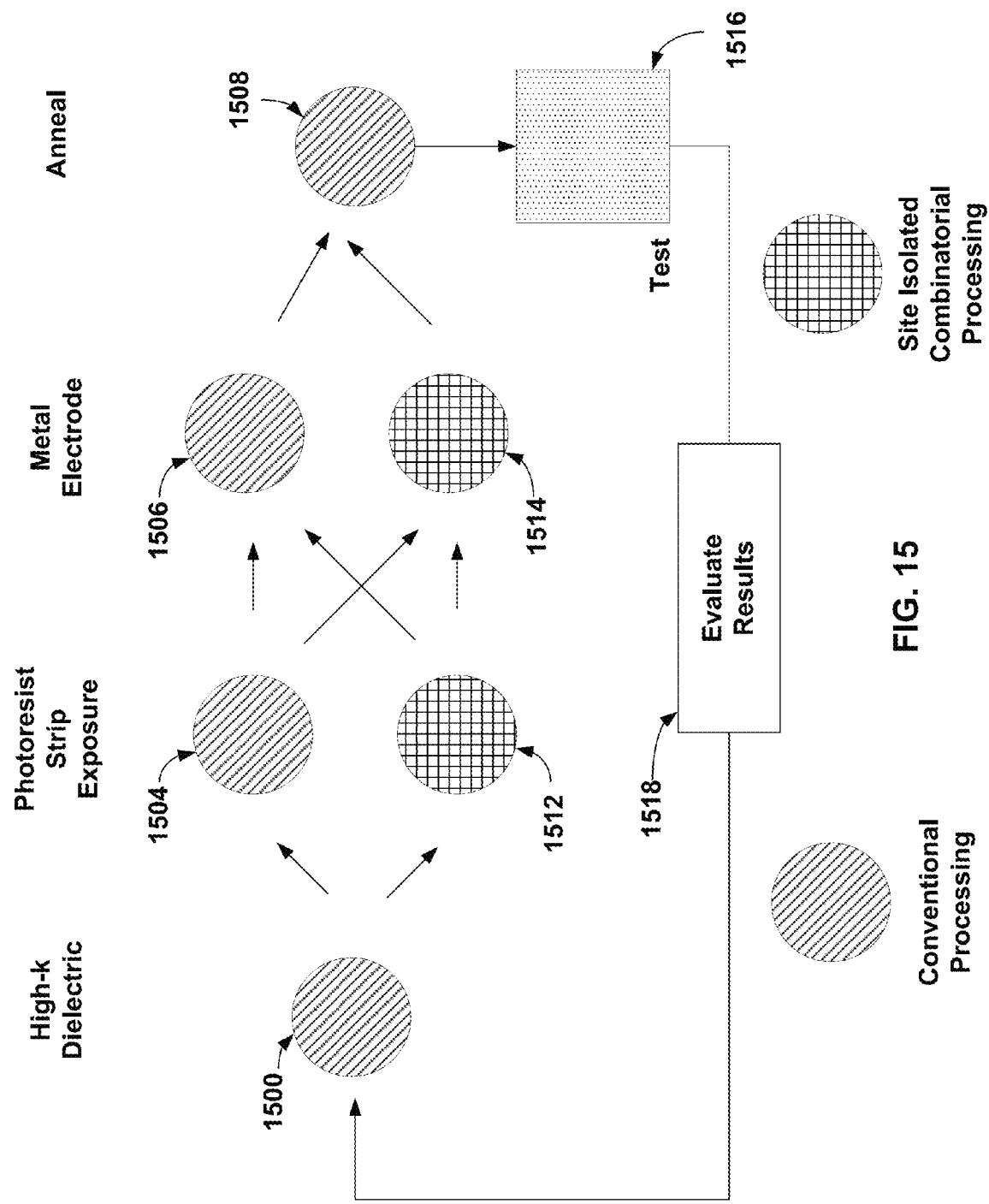
FIG. 15 illustrates a flow diagram for forming another exemplary test structure evaluation according to an embodiment described herein.

FIG. 15 illustrates a flow diagram for forming another exemplary test structure evaluation according to an embodiment described herein. Additional layers can be included in the test methodology, including the metal gate electrode layer. Through the use of a combination of conventional and combinatorial processing systems (i.e. systems capable of processing multiple isolated regions on a single substrate) a number of trajectories through the various systems illustrated in the flow diagram of FIG. 15 can be envisioned. In FIG. 15, the high-k dielectric layer may be deposited in a conventional processing manner, 1500, in some embodiments where the high-k dielectric layer is not a variable. As discussed previously, the photoresist strip exposure may be processed in a conventional processing manner, 1504, or in a site isolated combinatorial processing manner, 1512. The metal electrode layer may be deposited in a conventional processing manner, 1506, or in a site isolated combinatorial processing manner, 1514. The anneal process, such as a post metallization anneal in forming gas, may be processed in a conventional processing manner, 1508. After the deposition of the various layers and subsequent processing, the various MOS capacitor devices represented by each of the site isolated regions may be testing in step 1516, and the results evaluated in step, 1518. As discussed previously, the results will form the basis for additional cycles of investigation through HPC techniques to identify materials and process conditions that evaluate the suitability of photoresist strip exposure with respect to different metal gate electrode in devices having the given high-k dielectric.

Using the simple diagram in FIG. 15, there are four possible trajectories through the process sequence. These four trajectories encompass all of the possible combinations of conventional and combinatorial processing illustrated. Those skilled in the art will understand that HPC techniques may be applied to other processes not illustrated such as anneal treatments, cleaning, rinsing, etching, surface treatments, surface functionalization, etc. As more variable process steps are included, the total number of required experiments increases dramatically. This illustrates the benefits of using HPC techniques to limit the number of substrates to a manageable number and minimize the cost of the development program.

Figure 16:
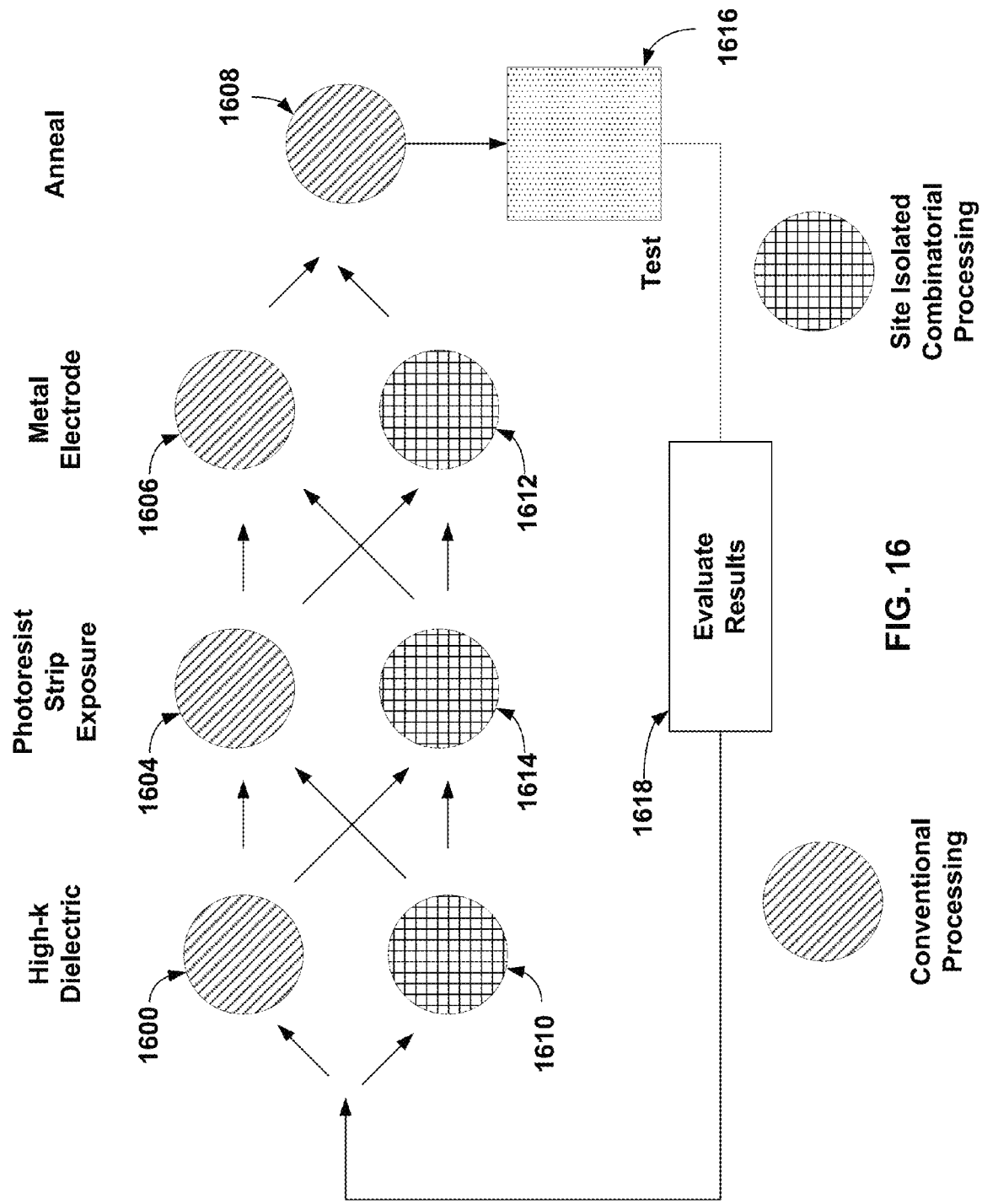
FIG. 16 illustrates a flow diagram for forming another exemplary test structure evaluation according to an embodiment described herein.

FIG. 16 illustrates a flow diagram for forming another exemplary test structure evaluation according to an embodiment described herein. Additional layers can be included in the test methodology, including the metal gate electrode layer and the high-k dielectric. Through the use of a combination of conventional and combinatorial processing systems (i.e. systems capable of processing multiple isolated regions on a single substrate) a number of trajectories through the various systems illustrated in the flow diagram of FIG. 16 can be envisioned. In FIG. 16, the high-k dielectric layer may be deposited in a conventional processing manner, 1600, or in a site isolated combinatorial processing manner, 1610. As discussed previously, the photoresist strip exposure may be processed in a conventional processing manner, 1604, or in a site isolated combinatorial processing manner, 1612. The metal electrode layer may be deposited in a conventional processing manner, 1606, or in a site isolated combinatorial processing manner, 1614. The anneal process, such as a post metallization anneal in forming gas, may be processed in a conventional processing manner, 1608. After the deposition of the various layers and subsequent processing, the various MOS capacitor devices represented by each of the site isolated regions may be testing in step 1616, and the results evaluated in step, 1618. As discussed previously, the results will form the basis for additional cycles of investigation through HPC techniques to identify materials and process conditions that evaluate the suitability of photoresist strip exposure with respect to different metal gate electrode and high-k dielectric.

Using the simple diagram in FIG. 16, there are eight possible trajectories through the process sequence. These eight trajectories encompass all of the possible combinations of conventional and combinatorial processing illustrated. Those skilled in the art will understand that HPC techniques may be applied to other processes not illustrated such as anneal treatments, cleaning, rinsing, etching, surface treatments, surface functionalization, etc. As more variable process steps are included, the total number of required experiments increases dramatically. This illustrates the benefits of using HPC techniques to limit the number of substrates to a manageable number and minimize the cost of the development program.

Figure 17:
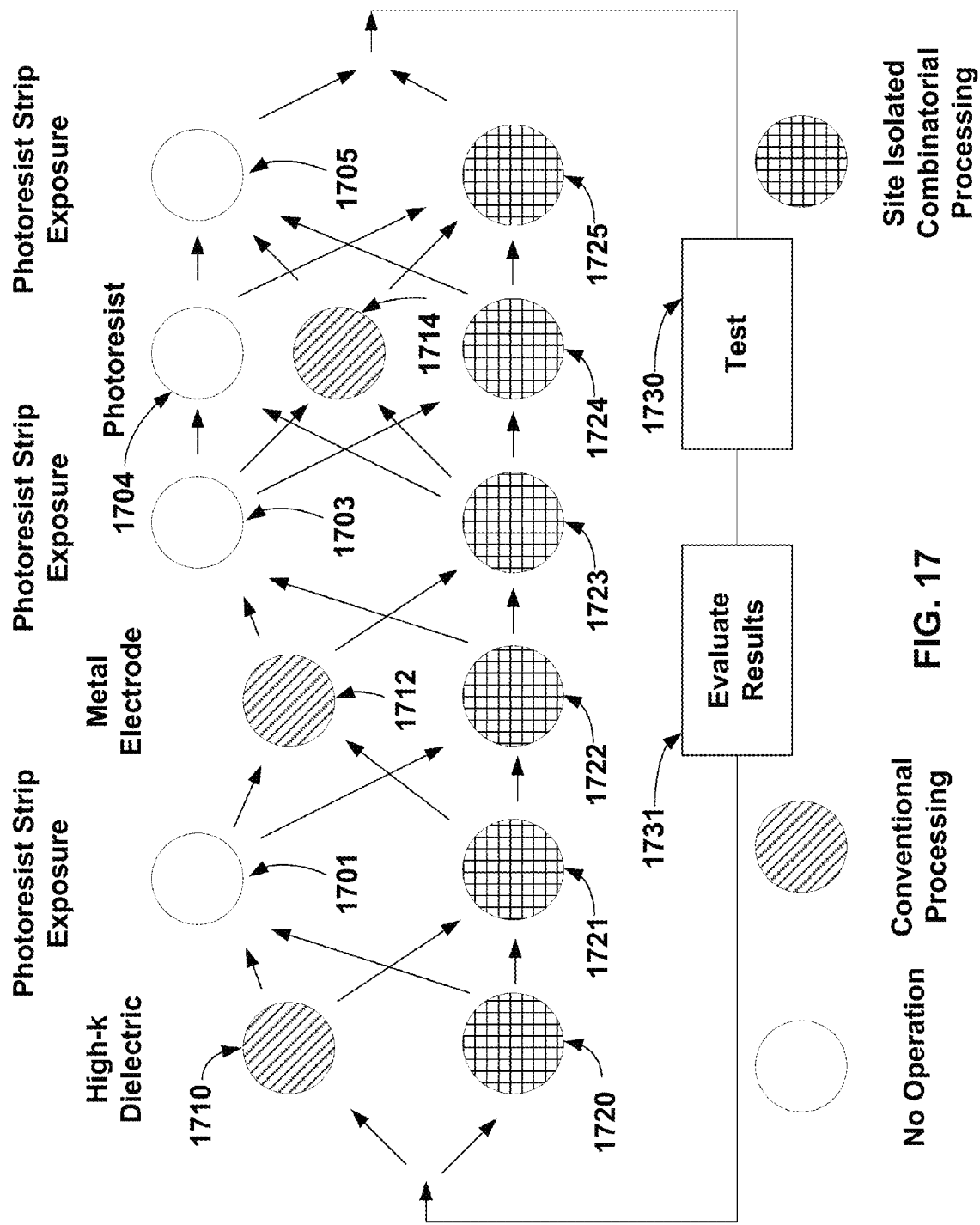
FIG. 17 illustrates another flow diagram for forming an exemplary test structure evaluation according to an embodiment described herein.

FIG. 17 illustrates another flow diagram for forming an exemplary test structure evaluation according to an embodiment described herein. Several of the layers provide opportunities to apply combinatorial techniques to the development and investigation of the photoresist strip chemicals. Layer candidates include the high-k dielectric layer, the metal electrode layer, and the photoresist layer. These three layers can be processed in a conventional processing manner, or in a site isolated combinatorial processing manner. Sandwiched between these layers are the photoresist strip exposure, which can be skipped (no operation), or processed in a site isolated combinatorial processing manner.

Through the use of a combination of conventional and combinatorial processing systems, a number of trajectories through the various systems illustrated in the flow diagram of FIG. 17 can be envisioned. In FIG. 17, the high-k dielectric layer may be deposited in a conventional processing manner, 1710, or in a site isolated combinatorial processing manner, 1720. The photoresist strip exposure may be skipped, 1701, or processed in a site isolated combinatorial processing manner, 1721. The metal electrode layer may be deposited in a conventional processing manner, 1712, or in a site isolated combinatorial processing manner, 1722. The photoresist strip exposure may be skipped, 1703, or processed in a site isolated combinatorial processing manner, 1723. The photoresist layer may be skipped, 1704, deposited in a conventional processing manner, 1714, or in a site isolated combinatorial processing manner, 1724. The photoresist strip exposure may be skipped, 1705, or processed in a site isolated combinatorial processing manner, 1725.

After the deposition of the various layers and subsequent processing, the various MOS capacitor devices represented by each of the site isolated regions may be testing in step 1730, and the results evaluated in step, 1731. As discussed previously, the results will form the basis for additional cycles of investigation through HPC techniques to identify materials and process conditions that evaluate the suitability of photoresist strip exposure with respect to different metal gate electrode and high-k dielectric. Control devices can be included in the process sequence, for example, through the sequence 1710/1720 to 1701 to 1712/1722 to 1703 to 1704 to 1705.

Figure 18:
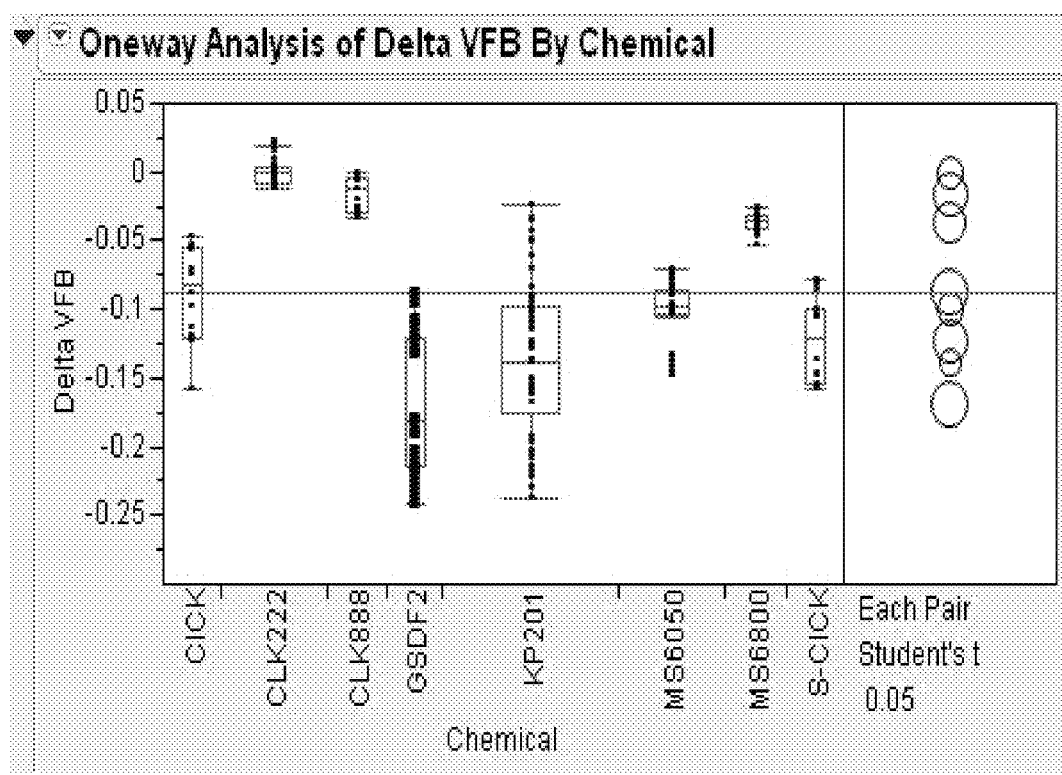
FIG. 18 illustrates a flatband voltage shift comparison between 8 different photoresist strip chemicals according to some embodiments of the present invention.

FIG. 18 illustrates a flatband voltage shift comparison between 8 different photoresist strip chemicals according to some embodiments of the present invention. The electrical data is collected from process sequence 1710-1721-1712-1703-1704-1705, together with additional steps of water rinsing after photoresist strip exposure, and a post metallization anneal after the electrode deposition. As shown, photoresist strip chemicals can have different side effects on the device characteristics, represented by the flatband voltage shift, which is an indication of the fixed or mobile charges generated in the high-k dielectric or at the high-k dielectric-semiconductor interface. Photoresist strip chemical #2 is best, followed closely by photoresist strip chemical #3, while photoresist strip chemical #7 is acceptable. Other photoresist chemicals are below an acceptable criterion, which is roughly about 10 mV for a first screening test.

Additional electrical data can be collected, such as I-V and C-V curves. For example, electrical data measurements include cycling I-V curves measuring I-V hysteresis and with changing I-V sweep speed, and cycling C-V curves measuring C-V hysteresis and with changing C-V sweep speed and frequency. The I-V and C-V data can disclose possible correlation of the photoresist strip chemical exposure to defect states.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for screening photoresist strip chemicals in a combinatorial manner, the method comprising
    forming a dielectric layer on a semiconductor substrate;
    defining a plurality of site isolated regions on the dielectric layer;
    applying a photoresist strip chemical to each site isolated region, wherein at least one of the composition or the application condition of the photoresist strip chemical is varied in a combinatorial manner between the site isolated regions;
    forming an electrode in each site isolated region, wherein the electrode, dielectric layer, and substrate form a capacitor device; and
    measuring an electrical characteristic of the capacitor device formed within each site isolated region.

2. The method of claim 1 further comprising comparing the electrical characteristic of the capacitor device in one site isolated region with the electrical characteristic of the capacitor device in another site isolated region.

3. The method of claim 1 wherein a site isolated region of the plurality of site isolated regions is a control site isolated region, wherein the electrode, dielectric layer, and substrate in the control site isolated region form a control capacitor device, and wherein varying at least one of the composition or the application condition of the photoresist strip chemical in a combinatorial manner between the site isolated regions comprises not applying photoresist strip chemicals to the control site isolated region,
    the method further comprising
    measuring an electrical characteristic of the control capacitor device; and
    comparing the electrical characteristic of the capacitor device with the electrical characteristic of the control capacitor device.

4. The method of claim 1 wherein the electrical characteristic measurement comprises at least one of an I-V measurement, a C-V measurement, a flatband voltage shift measurement, or an effective work function measurement.

5. The method of claim 1 wherein the dielectric layer comprises a high-k dielectric material.

6. The method of claim 1 wherein the dielectric layer comprises hafnium oxide.

7. The method of claim 1 wherein the electrode comprises a metal.

8. The method of claim 1 wherein the electrode comprises TiN, TiAlN, or TiLaN.

9. The method of claim 1 further comprising annealing the semiconductor substrate after forming the electrode.

10. The method of claim 1 wherein the electrode is formed by a shadow mask deposition process.

11. The method of claim 1 wherein varying at least one of the composition or the application condition of the photoresist strip chemical in a combinatorial manner between the site isolated regions comprises not applying photoresist strip chemicals to a site isolated region.

12. The method of claim 1, wherein the electrode is formed before the photoresist strip chemical is applied.

13. The method of claim 1, wherein the photoresist strip chemical is applied before the electrode is formed.

14. A method for screening photoresist strip chemicals in a combinatorial manner, the method comprising
    forming a dielectric layer on a semiconductor substrate;
    forming a plurality of electrodes on the dielectric layer;
    defining a plurality of site isolated regions on the dielectric layer, wherein each site isolated region comprises an electrode of the plurality of electrodes, and wherein the electrode, dielectric layer, and substrate form a capacitor device;
    applying a photoresist strip chemical to each site isolated region, wherein at least one of the composition or the application condition of the photoresist strip chemical is varied in a combinatorial manner between the site isolated regions; and
    measuring an electrical characteristic of the capacitor device formed within each site isolated region.

15. The method of claim 14 further comprising comparing the electrical characteristic of the capacitor device in one site isolated region with the electrical characteristic of the capacitor device in another site isolated region.

16. The method of claim 14 wherein a site isolated region of the plurality of site isolated regions is a control site isolated region, wherein the electrode, dielectric layer, and substrate in the control site isolated region form a control capacitor device, and wherein varying at least one of the composition or the application condition of the photoresist strip chemical in a combinatorial manner between the site isolated regions comprises not applying photoresist strip chemicals to the control site isolated region,
    the method further comprising
    measuring an electrical characteristic of the control capacitor device; and
    comparing the electrical characteristic of the capacitor device with the electrical characteristic of the control capacitor device.

17. The method of claim 14 wherein the electrical characteristic measurement comprises at least one of an I-V measurement, a C-V measurement, a flatband voltage shift measurement, or an effective work function measurement.

18. The method of claim 14 wherein the dielectric layer comprises a high-k dielectric material.

19. The method of claim 14 wherein the plurality of electrodes comprise a metal.

20. The method of claim 14 wherein varying at least one of the composition or the application condition of the photoresist strip chemical in a combinatorial manner between the site isolated regions comprises not applying photoresist strip chemicals to a site isolated region.

\* \* \* \* \*